(12) United States Patent
Wallace et al.

(10) Patent No.: US 9,767,154 B1
(45) Date of Patent: *Sep. 19, 2017

(54) SYSTEM AND METHOD FOR IMPROVING DATA COMPRESSION OF A STORAGE SYSTEM IN AN ONLINE MANNER

(71) Applicant: EMC Corporation, Hopkinton, MA (US)

(72) Inventors: Grant Wallace, Pennington, NJ (US); Frederick Douglis, Basking Ridge, NJ (US); Philip Shilane, Yardley, PA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/336,769

(22) Filed: Oct. 27, 2016

Related U.S. Application Data

(63) Continuation of application No. 14/038,635, filed on Sep. 26, 2013, now Pat. No. 9,514,146.

(51) Int. Cl.
*G06F 17/30* (2006.01)

(52) U.S. Cl.
CPC ................ *G06F 17/30501* (2013.01)

(58) Field of Classification Search
CPC ................................................ G06F 17/30153
See application file for complete search history.

(56) References Cited

U.S. PATENT DOCUMENTS

| | | | |
|---|---|---|---|
| 6,157,965 A | 12/2000 | Mohammed | |
| 6,912,316 B2 | 6/2005 | Botchkarev | |
| 7,453,377 B2 | 11/2008 | Lee et al. | |
| 7,761,458 B1 | 7/2010 | Eshghi et al. | |
| 8,140,821 B1 | 3/2012 | Raizen et al. | |
| 8,214,517 B2 | 7/2012 | Dubnicki et al. | |
| 8,447,740 B1 | 5/2013 | Huang et al. | |
| 8,595,188 B2 * | 11/2013 | Gruhl | G06F 11/1451 707/646 |
| 8,712,978 B1 | 4/2014 | Shilane et al. | |
| 8,832,045 B2 | 9/2014 | Dodd et al. | |
| 8,838,840 B1 | 9/2014 | Fair | |
| 8,918,390 B1 | 12/2014 | Shilane et al. | |
| 2008/0034268 A1 | 2/2008 | Dodd et al. | |
| 2008/0036630 A1 | 2/2008 | Lee et al. | |
| 2008/0133561 A1* | 6/2008 | Dubnicki | G06F 11/1453 |
| 2008/0154928 A1 | 6/2008 | Bashyam et al. | |
| 2008/0240226 A1 | 10/2008 | Okmianski et al. | |

(Continued)

*Primary Examiner* — Cam-Y Truong
(74) *Attorney, Agent, or Firm* — Blakely, Sokoloff, Taylor & Zafman LLP

(57) ABSTRACT

Techniques for improving data compression of a storage system in an online manner are described herein. According to one embodiment, in response to a sequence of data to be stored, the sequence of data is partitioned into a plurality of data chunks according to a predetermined chunking algorithm. A sketch for each of the data chunks is generated based on one or more features extracted from the data chunk. Each of the data chunks of the sequence of data is associated with one of a plurality of groups based on the sketch, wherein each group is represented by a sketch. The data chunks of each group are compressed and stored in a compression region of the storage systems, such that similar data chunks are compressed and stored in the same compression region.

15 Claims, 30 Drawing Sheets

(56) References Cited

U.S. PATENT DOCUMENTS

| | | |
|---|---|---|
| 2008/0256326 A1 | 10/2008 | Patterson et al. |
| 2009/0313248 A1 | 12/2009 | Balachandran et al. |
| 2010/0125553 A1* | 5/2010 | Huang ............... G06F 11/1453 707/661 |
| 2010/0306412 A1 | 12/2010 | Therrien et al. |
| 2011/0087912 A1 | 4/2011 | Dickson |
| 2011/0307447 A1 | 12/2011 | Sabaa et al. |
| 2011/0307659 A1 | 12/2011 | Hans et al. |
| 2012/0044990 A1 | 2/2012 | Bivolarsky et al. |
| 2012/0047284 A1 | 2/2012 | Tarkoma |
| 2012/0137061 A1 | 5/2012 | Yang et al. |
| 2014/0006685 A1* | 1/2014 | Peterson ............. G06F 12/0238 711/102 |

* cited by examiner

| Sketches 601 | Chunk IDs 602 |
|---|---|
|  |  |
|  |  |
| ⋮ | ⋮ |
|  |  |

FIG. 6A

SYSTEM AND METHOD FOR IMPROVING DATA COMPRESSION OF A STORAGE SYSTEM IN AN ONLINE MANNER

RELATED APPLICATIONS

This application is a continuation application of U.S. application Ser. No. 14/038,635, filed May 31, 2013, which is incorporated by reference herein in its entirety.

FIELD OF THE INVENTION

Embodiments of the present invention relate generally to data storage systems. More particularly, embodiments of the invention relate to improving data compression of a storage system in an online manner.

BACKGROUND

Data compression is a widely used technique for storage and network transfer. Compression is a class of data transformation techniques to represent information with fewer bits than its original form by exploiting statistical redundancy. Applying compression is a common technique to reduce the amount of data that needs to be stored or moved. There are numerous compression algorithms such as Lempel-Ziv (LZ), Huffman encoding, Deflate (a combination of LZ and Huffman), and many others. In addition, there are techniques that supplement compression by making data more effectively compressed: the Burrows-Wheeler Transform is a widely used example of such techniques. These compression techniques are lossless in the sense that decompression of compressed data will result in the exact same data as the beginning state.

When compressors run, they typically have a window over which they can find internal redundancy that may be in the tens of kilobytes up to megabytes. (Windows up to 1 GB or more are possible as well; the larger the redundancy window, the longer it takes to compress data.) This is due to internal structures that are optimized to find redundancy nearby as compared to distantly. As an example, a reference may only have 16 bits, so it can only reference data that is $2^{16}$ bytes away. Generally, there is a tradeoff between computation and compressibility: often much of the available compression in a dataset can be achieved with a small amount of computation, and more extensive computation (and memory) can result in better data reduction. It is advantageous to find redundancy over larger intervals while minimizing the additional overhead in computation and memory.

There have been previous techniques, often called delta or similarity compression, that compress some data relative to other data. One way to apply delta compression is to divide incoming data into smaller units called data chunks, generate a resemblance hash over a portion of the data chunk, such as a super feature or pairwise intersection of one or more super features (referred to herein as a "sketch"), and check the sketch against an index of previously stored data chunks. A sketch can be generated by identifying "features" of a data chunk, most of which would likely not change even as small variations are introduced into the data chunk. In one example, a rolling hash function (e.g., a Rabin fingerprint) is applied over all overlapping small regions of the data chunk (e.g., a 32-byte window) and the features are selected from maximal hash values generated in the process. This can be done with multiple hash functions to generate any number of independent features (e.g., generating sixteen features).

These features can be further processed to generate "super features," which can be generated by the application of a hashing function over subsets of the feature values. For example, if sixteen features are grouped into four super features, a change to one of the sixteen features affects the super feature it is grouped into, but the three other super features are unchanged. While features are described herein as being used for similarity matching, one skilled in the art would understand that super features can also be used for this purpose and are considered herein as a subset of the use of features and feature matching.

Data chunks with identical or similar sketches are considered for delta compression, while sketches that are not found in the index cause the corresponding data chunk to be stored and the sketch added to the index. In this way only a sub-set of the data chunks need to be stored in their entirety. For each data chunk with a matched sketch the system encodes a data chunk as a reference to the similar data chunk (i.e., the data chunk with the matching sketch) and a difference or change in the data chunk being compressed relative to the similar data chunk. In this way, only the original data chunk and a difference (i.e., the delta) between the two similar data chunks are stored rather than two entire data chunks, thereby significantly reducing the amount of data that must be stored.

Each of the data chunks can also have a cryptographic hash executed over its content to generate a result that is referred to herein as a "fingerprint." A fingerprint can be utilized to identify a specific data chunk. The data chunks can be portions of a file. The file has a recipe for reconstruction, which can consist of a list of fingerprints or storage locations and related information corresponding to the chunks stored in the data storage system.

BRIEF DESCRIPTION OF THE DRAWINGS

Embodiments of the invention are illustrated by way of example and not limitation in the figures of the accompanying drawings in which like references indicate similar elements.

FIG. 6A is a block diagram illustrating an indexing data structure according to one embodiment of the invention.

DETAILED DESCRIPTION

Figure 1:
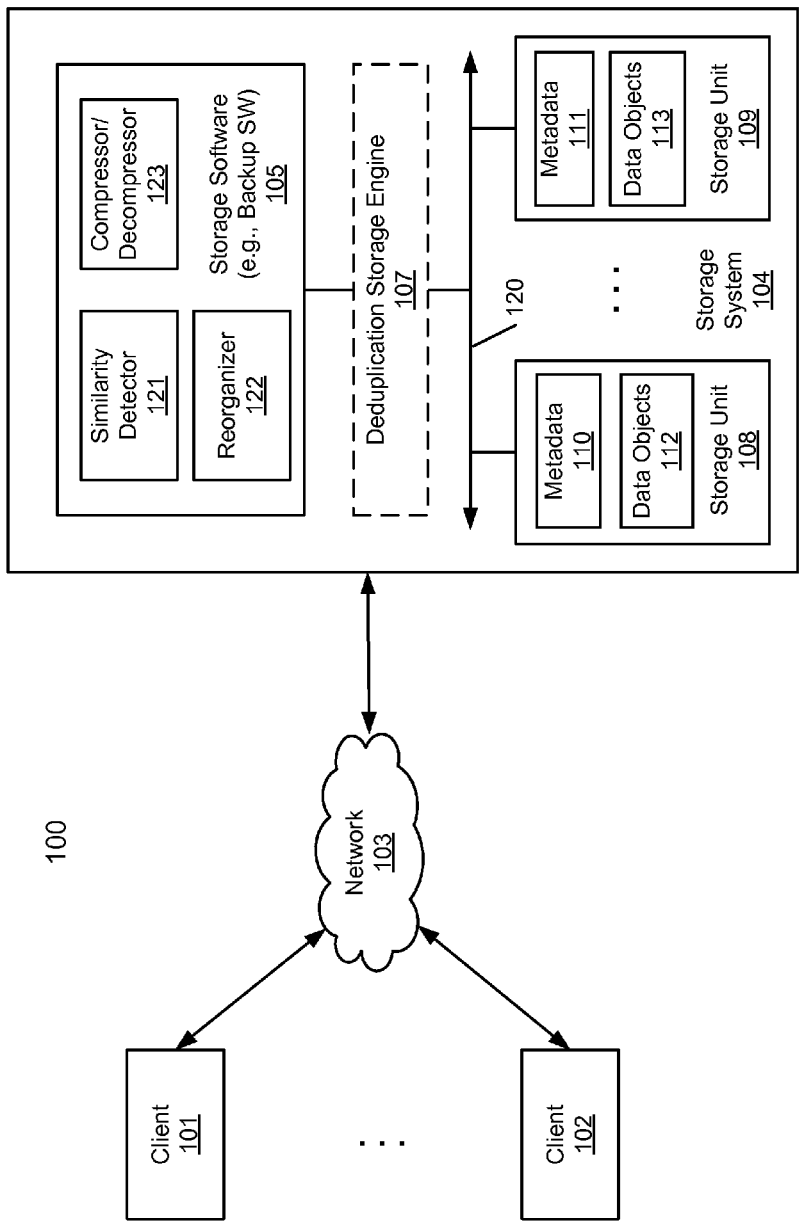
FIG. 1 is a block diagram illustrating a storage system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Techniques for efficient data compression of data chunks stored in a storage system with balancing the complexity and performance are described herein. The techniques improve compression by finding similar data regions and moving them close together so that standard compressors can be more effective. Data is partitioned into chunks (fixed or variable size), where each data chunk is represented with a sketch that indicates the similarity of the data chunk. The data chunks are reordered so that similar chunks are positioned near each other, and a standard compressor is applied. Metadata is preserved so the original content can be reconstructed for restoration subsequently. The compression tends to be higher after the rearrangement because similar data tends to compress better than dissimilar data.

According to one aspect of the invention, embodiments of data compression techniques can be applied to improving data compression of a file. According to one embodiment, when a file (represented by a sequence of data) is received for compression, the file is partitioned into multiple data chunks, which is in a first sequence order within the original file as received. The similarity of the data chunks is determined based on matching of data patterns of the data chunks. A data pattern of a data chunk can be a feature extracted from content of the data chunk, a super feature formed based on multiple features of the data chunk, or a sketch formed based on multiple super features of the data chunk. The data chunks are then reorganized into a second sequence order based on the similarity of the data chunks (e.g., a second sequence of data), where the second sequence order is different than the first sequence order. The reorganized data chunks are then compressed into a second file, such that similar data chunks are stored and compressed together in the second file. As a result, the compression rate or compression efficiency of a file is greatly improved. In addition, according to one embodiment, a file recipe is generated for mapping between the first and second sequence orders of the data chunks. The file recipe is maintained by a storage system storing the second file, such that the first file can be reconstructed from the second file based on the file recipe. The file recipe may be embedded within the second file, for example, as part of file header or metadata of the second file.

According to another aspect of the invention, embodiments of data compression techniques can be applied to improving data compression of data chunks stored in a storage system. According to one embodiment, data chunks (e.g., deduplicated data chunks) stored in one or more first storage areas (e.g., compression regions (CRs) or containers) of a storage system (e.g., deduplicated storage system) are scanned to determine the similarity of the data chunks based on sketches of the data chunks. The data chunks are grouped into multiple groups based on the similarity of the data chunks. The groups of data chunks are then retrieved from the first storage areas, and compressed and stored to one or more second storage areas of the storage system, such that similar data chunks are compressed and stored close to each other to improve the compression efficiency of the storage system.

According to another aspect of the invention, embodiments of data compression techniques can be applied to improving data compression of data chunks to be stored in a storage system. According to one embodiment, when a file (e.g., a sequence of data) is received to be stored in a storage system, the file is partitioned into multiple data chunks according to a predetermined chunking algorithm. For each of the data chunks, a sketch is generated based on one or more features that are extracted from the corresponding data chunk. Each of the data chunks is then associated with one of the buckets (e.g., groups) based on its respective sketch. Each of the buckets is represented or associated with a different one of the sketches of the data chunks (e.g., non-repetitive or deduplicated sketch values). A bucket may be a buffer to temporarily store or reference data chunks that have the same sketch as the associated bucket. Thus, a bucket represents a group of similar data chunks that are identified by the associated sketch. The data chunks of a bucket are then compressed and stored together within the same storage area (e.g., CR or container), such that similar data chunks are compressed and stored close to each other. According to another embodiment, each of the buckets may also temporarily store existing similar data chunks that are identified and retrieved from the storage system based on their respective sketches. The newly received data chunks are concatenated (or merged) with the existing similar data chunks based on their respective sketches. The concatenated data chunks are then compressed and stored back to the storage system, either within the original storage area (or region) of the existing similar data chunks or in a new storage area (or region).

According to another aspect of the invention, embodiments of data compression techniques include techniques for balancing the data compression efficiency and the data access performance. According to one embodiment, similar data chunks stored in a storage system are identified based on their sketches. A first portion of the similar data chunks is associated with a first storage area (e.g., CR or container). In addition, one or more data chunks that are not similar to, but are likely accessed together with, the data chunks of the first portion are also associated with the first storage area. Thereafter, the first group of similar data chunks and the associated dissimilar data chunks are then compressed and stored in the first storage area. Similarly, a second portion of the similar data chunks is associated with a second storage area (e.g., CR or container) and one or more data chunks that are not similar to, but are likely accessed together with, the data chunks of the second portion are also associated with the second storage area. Thereafter, the second group of similar data chunks and the associated dissimilar data chunks are then compressed and stored in the second storage area. That is, only up to a limited or predetermined number of similar data chunks are compressed and stored together within a storage area. Some dissimilar data chunks that are likely accessed together with the similar data chunks are also compressed and stored within a storage area. Since all data chunks of a particular storage area, such as a compression region, are accessed together (e.g., via one or more input/output (TO) transactions), such an arrangement may greatly reduce the number of I/O operations and in turn increase the performance of accessing the data chunks, while the compression rate of the data chunks may also be reduced (as compared to putting all similar chunks together) for the purpose of balancing the compression rate with the I/O performance.

According to another aspect of the invention, embodiments of data compression techniques include an efficient indexing scheme to enable better data compression efficiency and data access performance. According to one embodiment, a region sketch is generated for each of the storage region (e.g., CR or container) of a storage system, where each storage region stores multiple data chunks. A region sketch may be generated based on the sketches of the data chunks stored therein. A region sketch index is maintained, wherein each entry maps from a region sketch to a reference to the corresponding data chunk. The entries in the region sketch index are sorted based on the sketches, such that similar regions are positioned adjacent to each other within the region sketch index. Thereafter, data chunks of the similar regions are reorganized and compressed based on the sketches of the data chunks to improve data compression of the data chunks of the similar regions, for example, by compressing and storing similar data chunks together.

System Overview

FIG. 1 is a block diagram illustrating a storage system according to one embodiment of the invention. Referring to FIG. 1, system 100 includes, but is not limited to, one or more client systems 101-102 communicatively coupled to storage system 104 over network 103. Clients 101-102 may be any type of clients such as a server, a personal computer (e.g., desktops, laptops, and tablets), a "thin" client, a personal digital assistant (PDA), a Web enabled appliance, a gaming device, a media player, or a mobile phone (e.g., Smartphone), etc. Alternatively, any of clients 101-102 may be a primary storage system that provides storage to other local clients, which may periodically back up the content stored therein to a backup storage system, such as storage system 104. Network 103 may be any type of networks such as a local area network (LAN), a wide area network (WAN) such as the Internet, a fiber network, a storage network, or a combination thereof, wired or wireless. Clients 101-102 may be in physical proximity or may be physically remote from one another. Storage system 104 may be located in proximity to one, both, or neither of clients 101-102.

Storage system 104 may include any type of server or cluster of servers. For example, storage system 104 may be a storage server used for any of various different purposes, such as to provide multiple users with access to shared data and/or to back up data (e.g., mission critical data). In one embodiment, storage system 104 includes, but is not limited to, storage software 105 (e.g., backup engine, garbage collector), deduplication storage engine 107, and one or more storage units 108-109 communicatively coupled to each other. Storage units 108-109 may be implemented locally (e.g., single node operating environment) or remotely (e.g., multi-node operating environment) via interconnect 120, which may be a bus and/or a network (e.g., a storage network or a network similar to network 103). Storage units 108-109 may include a single storage device such as a hard disk, a tape drive, a semiconductor memory, a plurality of storage devices such as a redundant array system (e.g., a redundant array of independent disks (RAID)), a system for storage such as a library system or network attached storage system, or any other appropriate storage device or system.

In response to a data file to be stored in storage units 108-109, deduplication storage engine 107 is configured to partition or segment the data file into multiple chunks (also referred to as segments) according to a variety of segmentation policies or rules. Note that throughout this application, embodiments of the invention may be described in view of a deduplicated storage system such as storage 104. However, the techniques described throughout this application can also be applied to a regular storage system. In the event that storage system 104 is just a regular storage system (instead of a deduplicated storage system), engine 107 represents a chunking engine (e.g. segmentation engine) without the deduplication functionality. Deduplication storage engine 107 may choose not to store a chunk in a storage unit if the chunk has been previously stored in the storage unit. In the event that deduplication storage engine 107 chooses not to store the chunk in the storage unit, it stores metadata enabling the reconstruction of the file using the previously stored chunk. As a result, chunks of data files are stored in a deduplicated manner, either within each of storage units 108-109 or across at least some of storage units 108-109. The metadata, such as metadata 110-111, may be stored in at least some of storage units 108-109, such that files can be accessed independently of another storage unit. Metadata of each storage unit includes enough information to provide access to the files it contains.

In one embodiment, storage software 105 includes similarity detector 121, reorganizer 122, and compressor and decompressor 123. Similarity detector 121 is configured to detect or determine the similarity of data chunks based on their respective features, super features, and/or sketches. Based on the similarity of the data chunks, reorganizer 122 is configured to reorganize or rearrange the order or locations of the data chunks, such that similar data chunks are grouped together. Thereafter, compressor 123 is configured to compress the grouped similar data chunks and store them together in one of the storage units 108-109. As a result, the data compression of the data chunks stored can be greatly improved.

According to one embodiment, when a file is received for compression, the file is partitioned, for example, by a chunking engine (e.g. segmenter), into multiple data chunks, which is in a first sequence order within the original file as received. The similarity of the data chunks is determined by similarity detector 121 based on matching of data patterns of the data chunks. A data pattern of a data chunk can be a feature extracted from content of the data chunk, a super feature formed based on multiple features of the data chunk, or a sketch formed based on multiple super features of the data chunk. The data chunks are then reorganized by reorganizer 122 into a second sequence order based on the similarity of the data chunks, where the second sequence order is different than the first sequence order. The reorganized data chunks are then compressed by compressor 123 into a second file to be stored in storage system 104, such that similar data chunks are stored and compressed together in the second file. As a result, the compression rate or efficiency of a file is greatly improved. In addition, according to one embodiment, a file recipe (e.g., restore recipe) is generated for mapping between the first and second sequence orders of the data chunks. The file recipe is maintained by storage system 104 that is storing the second file, such that the first file can be reconstructed from the second file based on the file recipe. The file recipe may be embedded within the second file, for example, as part of file header or metadata of the second file.

According to another embodiment, data chunks (e.g., chunks 112-113) stored in one or more first storage areas (e.g., compression regions (CRs) or containers of storage units 108-109) of storage system 104 are scanned by similarity detector 121 to determine the similarity of the data chunks based on sketches of the data chunks. The sketches may be dynamically generated during the scanning, or alternatively retrieved from storage units 108-109, where the sketches were generated when the data chunks were stored in storage units 108-109. The data chunks are grouped by reorganizer 122 into multiple groups based on the similarity of the data chunks. The groups of data chunks are then retrieved from the first storage areas (and decompressed by decompressor 123), and compressed and stored by compressor 123 to one or more second storage areas (e.g., CRs, or containers) of the storage system, such that similar data chunks are compressed and stored close to each other to improve the compression efficiency of the storage system 104. The chunks from the first storage unit can be deleted such that there space becomes available for other storage purposes since they have been copied to the second storage unit. This process is referred to as an offline reorganization process to improve data compression of the data chunks after the data chunks have been stored in the storage system, which can be performed as part of a storage maintenance routine (e.g., garbage collection).

According to one embodiment, when a file is received to be stored in a storage system, the file is partitioned, for example, by a segmenter (not shown), into multiple data chunks according to a predetermined chunking algorithm. For each of the data chunks, a sketch is generated by a sketch generator (not shown) based on one or more features that are extracted from the corresponding data chunk. Each of the data chunks is then associated by reorganizer 122 with one of the buckets based on its respective sketch (representing the similarity which is detected by similarity detector 121). Each of the buckets is represented or associated with a different one of the sketches of the data chunks (e.g., non-repetitive sketch values). A bucket may be a buffer to temporarily store or link/reference data chunks that have the same sketch as the associated bucket. Thus, a bucket represents a group of similar data chunks that are identified or represented by the associated sketch. The data chunks of a bucket are then compressed by compressor 123 and stored together within the same storage area (e.g., CR or container) of storage units 108-109, such that similar data chunks are compressed and stored close to each other.

According to another embodiment, each of the buckets may also temporarily store existing similar data chunks that are identified and retrieved from storage units 108-109 of the storage system based on their respective sketches. The newly received data chunks are incorporated (e.g., merged or concatenated) with the existing similar data chunks based on their respective sketches. The incorporated data chunks are then compressed and stored back to the storage system, either within the original storage area of the existing similar data chunks or in a new storage area. This process is referred to as an online reorganization process to improve data compression of the data chunks prior to the data chunks being stored in the storage system.

According to one embodiment, similar data chunks stored in storage system 104 are identified by similarity detector 121 based on their sketches. A first portion (e.g., a limited amount) of the similar data chunks is associated by reorganizer 122 with a first storage area (e.g., CR or container) of storage units 108-109. In addition, one or more data chunks that are not similar to, but are likely accessed together with, the data chunks of the first portion are also associated by reorganizer 122 with the first storage area. Thereafter, the first group of similar data chunks and the associated dissimilar data chunks are then compressed by compressor 123 and stored in the first storage area. Similarly, a second portion of the similar data chunks is associated by reorganizer 122 with a second storage area (e.g., CR or container) and one or more data chunks that are not similar to, but are likely accessed together with, the data chunks of the second portion are also associated with the second storage area. Thereafter, the second group of similar data chunks and the associated dissimilar data chunks are then compressed by compressor 123 and stored in the second storage area.

That is, only up to a limited number of similar data chunks are compressed and stored together within a storage area. Some dissimilar data chunks that are likely accessed together with the similar data chunks are also compressed and stored within a storage area of storage units 108-109.

Since all data chunks of a particular storage area, such as a compression region, are accessed together (e.g., via one or more input/output (I/O) transactions), such an arrangement may greatly reduce the number of I/O operations and in turn increase the performance of accessing the data chunks, while the compression rate of the data chunks may also be reduced for the purpose of balancing the compression rate with the I/O performance.

According to one embodiment, a region sketch is generated for each of the storage region (e.g., CR or container) of storage units 108-109 storage system 104, where each storage region stores multiple data chunks. A region sketch may be generated based on the sketches of the data chunks stored therein. A region sketch index is maintained by storage system 104, which has many entries. Each entry corresponds to one of the region sketches. The entries in the region sketch index are sorted based on the sketches, such that similar regions are positioned adjacent to each other within the region sketch index. Alternatively, a region sketch index may use any of a number of standard indexing structures (hash table, tree, etc.) to group identical or similar region sketches together. Thereafter, data chunks of the similar regions are reorganized and compressed based on the sketches of the data chunks to improve data compression of the data chunks of the similar regions, for example, by compressing and storing similar data chunks together.

Embodiments of Improving Data Compression within a File

Figure 2A:
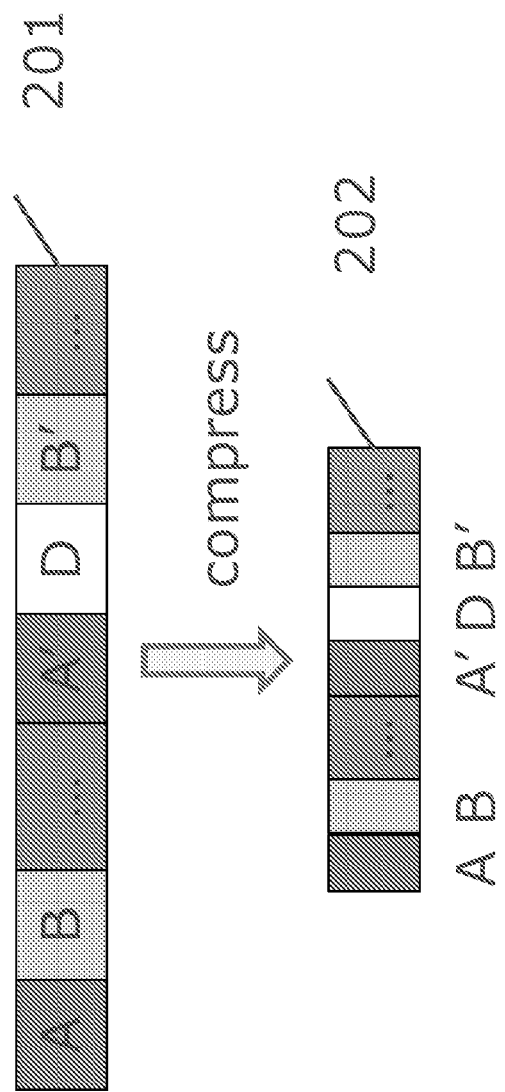
FIG. 2A is a block diagram illustrating a conventional data compression technique.

As described above, conventional compression techniques use a limited back-reference window in which to identify and eliminate redundant information but leave the data in its original order as shown in FIG. 2A. In this example as shown in FIG. 2A, file 201 is not reorganized but simply compressed with the data in place. One could imagine partitioning it into multiple data chunks, where chunk A is similar to chunk A' and chunk B is similar to chunk B'. But in this case file 201 is compressed into file 202 without identifying the similarity or reordering the data chunks. Since similar chunks A and A' and B and B' are not positioned adjacent to each other, the compression efficiency is limited.

Figure 2B:
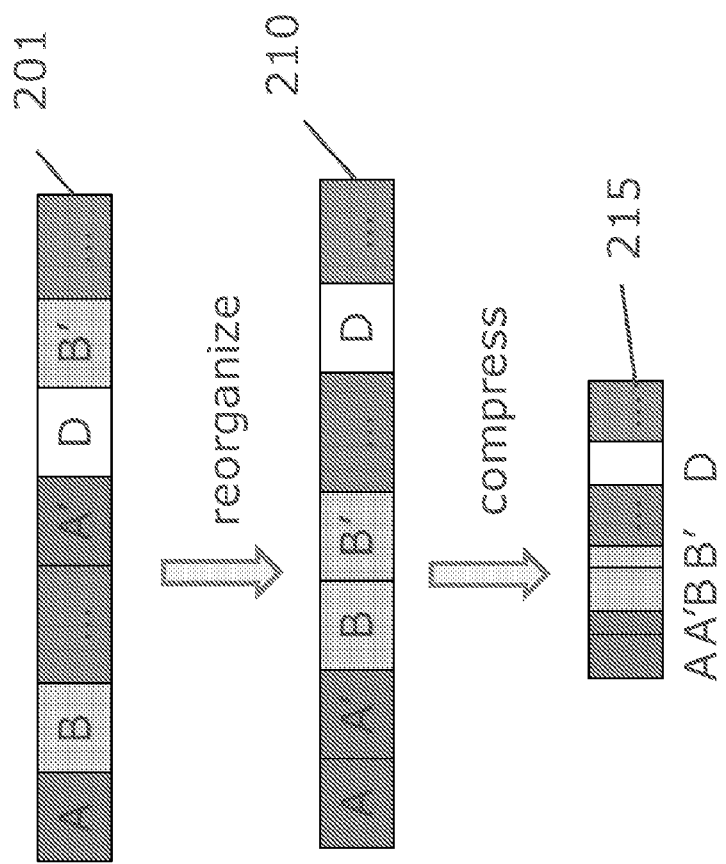
FIG. 2B is a block diagram illustrating an improved data compression technique according to one embodiment of the invention.

According to one embodiment, as shown in FIG. 2B, after file 201 has been partitioned into data chunks, the similarity of the data chunks is determined, for example, by similarity detector 121 of FIG. 1, based on their sketches (or other similarity or chunk representations such as one or more features of the data chunks). Based on their sketches, data chunks of file 201 are reorganized, for example, by reorganizer 122 of FIG. 1, into an intermediate data stream or file 210. In this example, similar chunks A and A', as well as similar chunks B and B' have been reorganized. The reorganized data chunks 210 are then compressed into compressed file 215 for storage or transfer.

Figure 3:
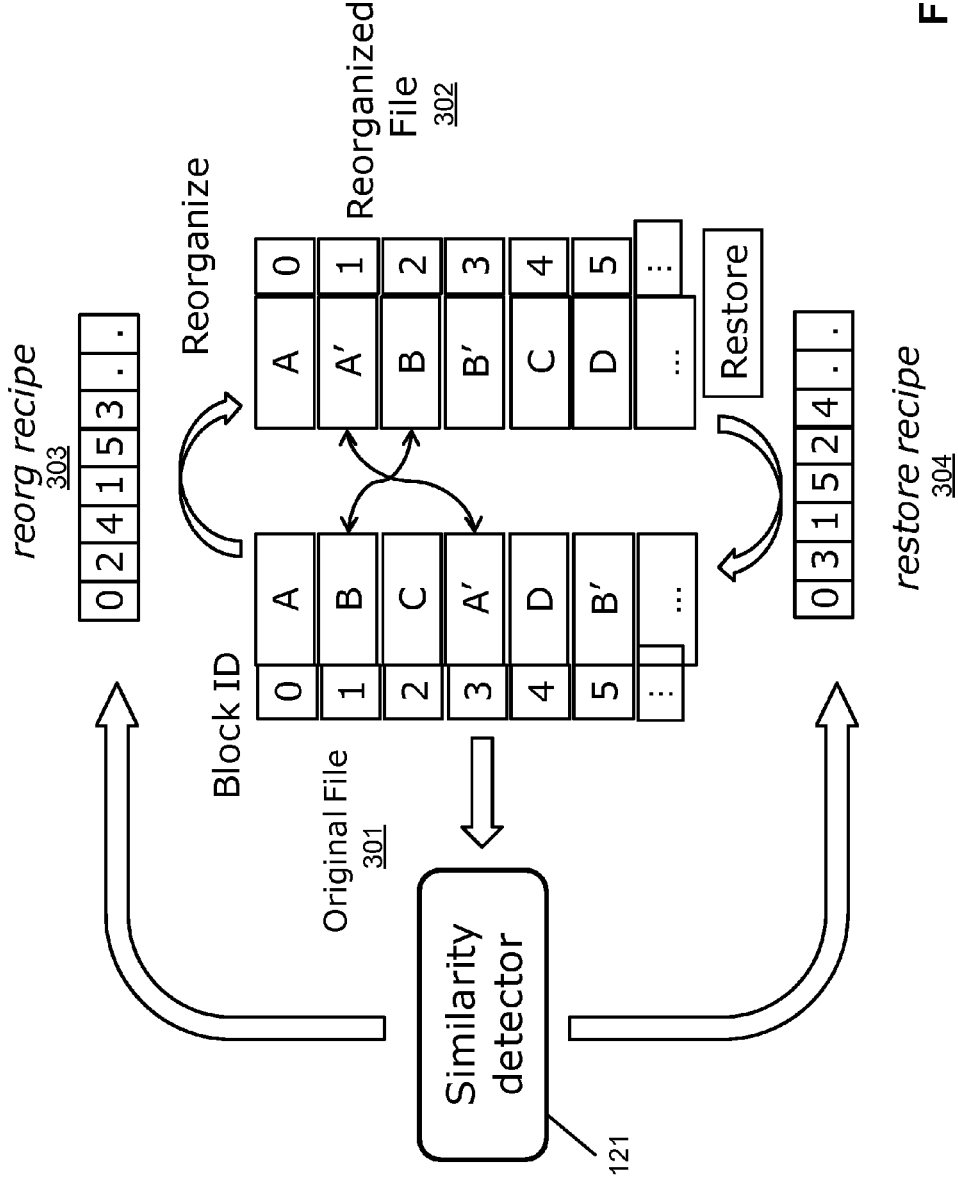
FIG. 3 is a block diagram illustrating a process of compressing data chunks of a file according to one embodiment of the invention.

FIG. 3 is a block diagram illustrating a process of compressing data chunks of a file according to one embodiment of the invention. System 300 may be implemented as part of system 100 of FIG. 1. Referring to FIG. 3, when an original file 301 is received, the file is partitioned into data chunks, in this example, chunks A, B, C, A', D, and B', and their sketches are generated from the data chunks. Similarity detector 121 determines the similarity of the data chunks based on the sketches. In this example, it is assumed chunk A is similar to chunk A' based on their sketches. Similarly, chunk B is similar to chunk B's based on their respective sketches. Based on the similarity, a reorganizer (not shown) is used to rearrange or reorder the data chunks into a reorganized file 302. In this example, the data chunks in a first sequence order (e.g., original sequence order of original file 301) of ABCA'DB' are rearranged into a second sequence order of AA'BB'CD, where similar chunks (A, A') and (B, B') are positioned adjacent to each other in reorganized file 302. The reorganized file 302 is then compressed and stored for storage or transfer over a network.

In one embodiment, based on the sketches of the data chunks of original file 301, similarity detector 121 generates a reorganize recipe 303 for mapping the data chunks of original file 301 to reorganized file 302. Similarity detector 121 also generates a restore recipe 304 for mapping data chunks of reorganized file 302 back to original file 301 during the restoration. In this example, reorganize recipe 303 contains mapping information: 0=>0, 1=>2, 2=>4, 3=>1, 4=>5, and 5=>3. Based on reorganize recipe 303, chunk A located at position 0 of original file 301 is mapped to position 0 of reorganized file 302; chunk B located at position 1 of original file 301 is mapped to position 2 of reorganized file 302; chunk C located at position 2 of original file 301 is mapped to position 4 of reorganized file 302, and so on. This reorganize recipe is used by Reorganizer 122 to create reorganized file 302.

Similarly, restore recipe 304 can be used to restore original file 301 from reorganized file 302. In this example, restore recipe 304 contains mapping information: 0=>0, 1=>3, 2=>1, 3=>5, 4=>2, and 5=>4. Based on restore recipe 304, chunk A located position 0 of reorganized file 302 is mapped to position 0 of original file 301; chunk A' located position 1 of reorganized file 302 is mapped to position 3 of original file 301; chunk B located position 2 of reorganized file 302 is mapped to position 1 of original file 301, and so on. The restore recipe is used when a client wishes to read back part or all of file 301. In one embodiment, restore recipe 304 may be maintained by the storage system or within reorganized file 302, such that it can be used during the restoration of original file 301 from reorganized file 302.

Figure 4:
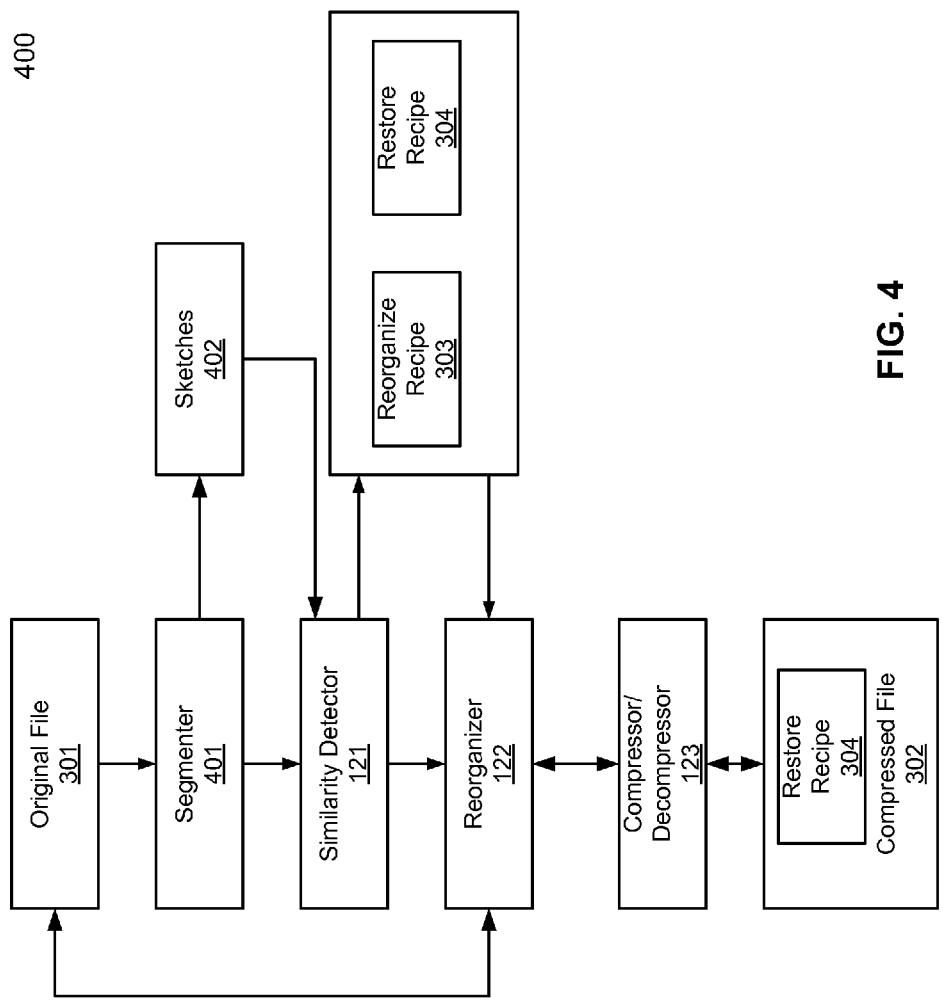
FIG. 4 is a block diagram illustrating a system architecture of improving data compression within a file according to one embodiment of the invention.

FIG. 4 is a block diagram illustrating a system architecture for improving data compression within a file according to one embodiment of the invention. System 400 may be implemented as part of a system as shown in FIG. 3. Referring to FIG. 4, when original file 301 is received for storage or transfer over a network, it is partitioned by segmenter 401 into multiple data chunks. In addition, segmenter 401 may generate or invoke a sketch generator to generate sketches 402 for the data chunks based on a variety of sketch generation algorithms. Based on sketches, similarity detector 121 is used to determine the similarity of the data chunks. In addition, similarity detector 121 may further generate recipes such as reorganize recipe 303 and restore recipe 304. The reorganize recipe 303 may be used by reorganizer 122 to reorganize the order of data chunks into a reorganized file, which may temporarily be buffered in the memory. The reorganized file is then compressed by compressor 123 into compressed file 302. In one embodiment, restore recipe 304 may also be stored within file 302, for example, as part of metadata of file 302. Subsequently, during the restoration, compressed file 302 is identified and decompressed by decompressor 123 to reveal data chunks and restore recipe 304. Based on restore recipe 304, reorganizer 122 is to reorganize the data chunks to recover original file 301.

The term "sketch" refers to a compact data structure that represents a chunk of data such that similar chunks can be found by comparing their sketches. In one embodiment, a sketch includes several sub-units referred to as super features. Each super feature is created based on hashing sub-regions of a data chunk (as opposed to generating a fingerprint based on the entire data chunk). In one embodiment, certain hashes such as the maximum hashes (or maximums of a function of a hash) across the sub-regions are selected. Then a hash of one or more concatenated maximal (or minimal) hash values is used as a super-feature. Thus, the more super-features that two chunks have in common because of shared data regions, the more compression that can be achieved by placing them together, though even a single super-feature match suggests significant similarity. Alternatively, a sketch can be computed with a single hash over a predetermined portion or block such as a prefix of a data chunk (e.g., the first N bytes of the data chunk, for an appropriate value of N that is large enough to distinguish trivial similarities but not the contents of an entire chunk; 64 bytes is an appropriate value).

A sketch represents characteristics of one or more different portions of a data chunk, while a fingerprint represents characteristics of the entire data chunk. A fingerprint of a data chunk effectively uniquely represents the corresponding data chunk. A sketch of a data chunk represents only some of the features within the data chunk, which may be common to other data chunks. Two chunks having the same sketch may only overlap portions of their content (e.g., they are similar but not identical), while two chunks having the same fingerprints contain the same content with extremely high probability. The data chunks can be partitioned as fixed sized chunks or variable sized chunks dependent upon the specific configuration or needs. Data chunks can be compressed using a variety of compression algorithms such as LZ, GZ, Huffman encoding, Burrows-Wheeler Transform, etc.

Figure 5A:
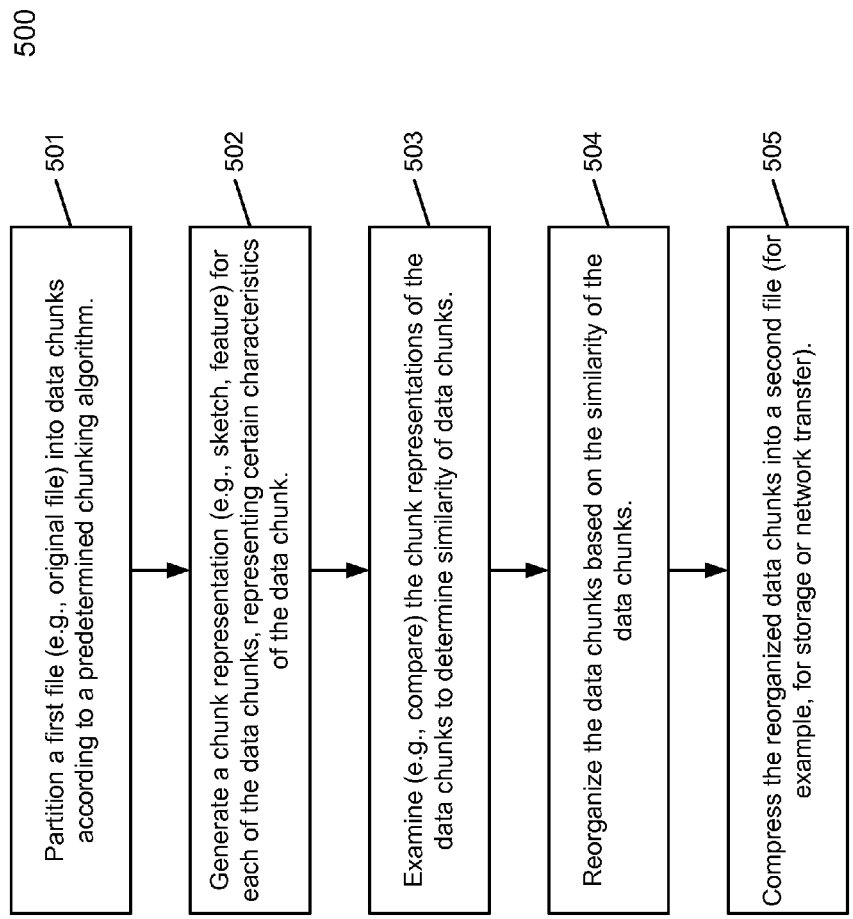
FIGS. 5A and 5B are flow diagrams illustrating a method for compressing a file according to certain embodiments of the invention.

FIG. 5A is a flow diagram illustrating a method for compressing a file according to one embodiment of the invention. Method 500 may be performed by processing logic which may include software, hardware, or a combination thereof. For example, method 500 may be performed by system 400 of FIG. 4. Referring to FIG. 5A, at block 501, processing logic partitions a file into data chunks according to a predetermined chunking algorithm. The file may be received to be stored in a storage system. Alternatively, the file is to be transferred to a remote node over a network (e.g., a backup file to be backed up from a client to a backup server). At block 502, processing logic generates a chunk representation for each of the data chunks, where a chunk representation includes information that can be used to determine or compute the similarity of the data chunk. A chunk representation can be generated based on a feature, a super feature, and/or a sketch of the data chunk. At block 503, processing logic examines the chunk representations of the data chunks to determine similarity of the data chunks. At block 504, processing logic reorganizes the data chunks based on the similarity of the data chunks. The reorganization of the data chunks may include altering the sequence order of the data chunks from a first sequence order of the original file to a second sequence order. At block 505, the reorganized data chunks are compressed and stored in a second file. In addition, a restore file recipe may be maintained, for example, within a file header of the second file, for subsequent restoration.

Figure 5B:
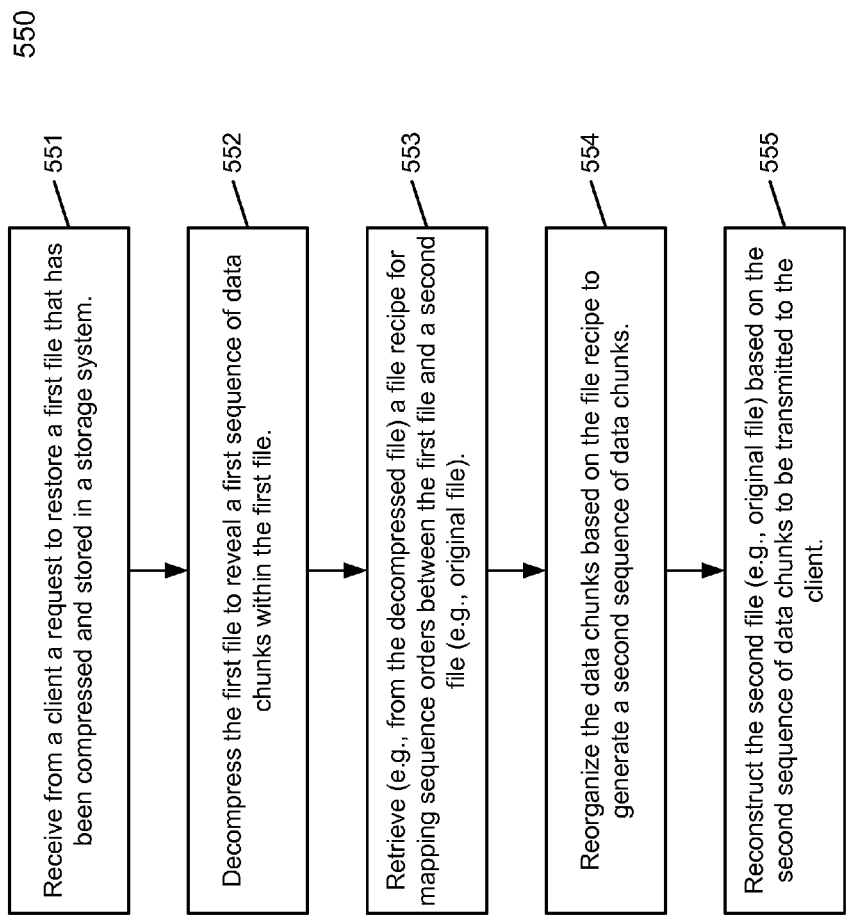

FIG. 5B is a flow diagram illustrating a method for restoring a file according to one embodiment of the invention. Method 550 may be performed by processing logic which may include software, hardware, or a combination thereof. For example, method 550 may be performed by system 400 of FIG. 4. Referring to FIG. 5B, at block 551, processing logic receives from a client a request to restore a first file that has been compressed and stored in a storage system. At block 552, processing logic decompresses the first file to recover data chunks in a first sequence order. At block 553, processing logic retrieves a restore file recipe associated with the first file, where the restore file recipe maps the sequence orders of the data chunks between the first file and a second file (e.g., original file). At block 554, processing reorganizes the data chunks into a second sequence order based on the restore file recipe. At block 555, processing logic reconstructs the second file based on the second sequence order, where the second file is transmitted to the client.

Figure 6A:
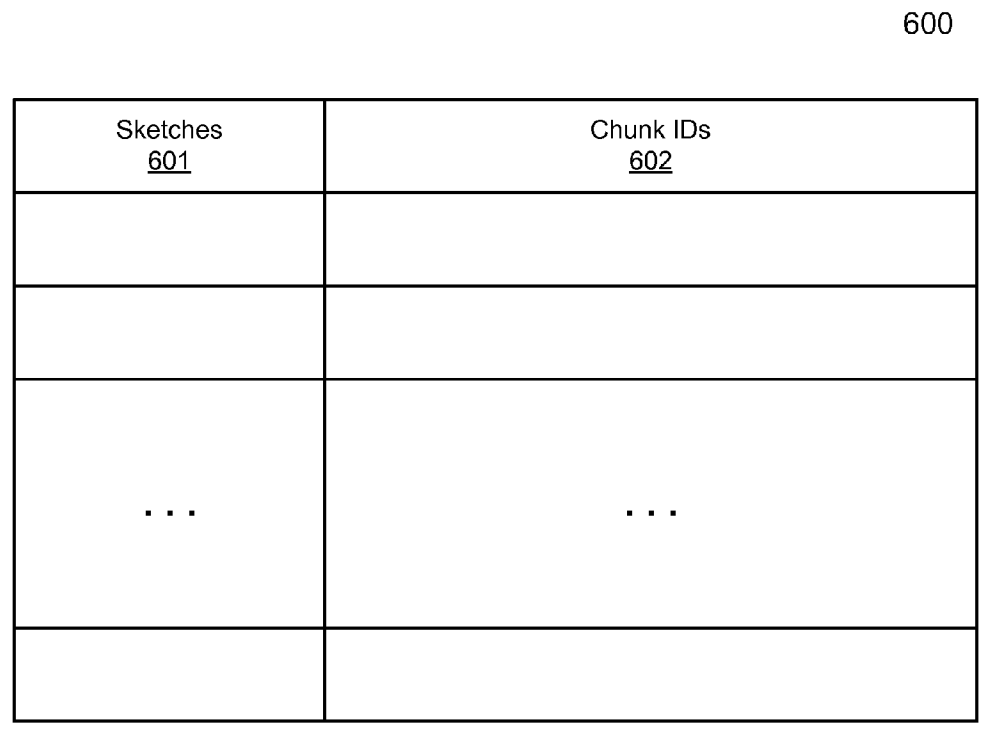

According to one embodiment, in order to find the similar data chunks, a data structure is utilized to index the data chunks based on their sketches. FIG. 6A is a diagram illustrating a sketch index data structure according to one embodiment of the invention. Referring to FIG. 6A, data structure 600 includes a data entry for each of the sketches of the data chunks, which may be associated with a file. Each data entry includes at least two data fields: sketch 601 and chunk ID 602. Sketch 601 may be the actual sketch value or alternatively a sketch ID or hash value representing a sketch. Chunk ID 602 may be a fingerprint of a data chunk or may be a file handle and offset or a storage system ID indicating the location of the data chunk. Thus, data structure 600 may include a number of entries corresponding to a number of data chunks of a file. Once all of the sketches and chunk IDs have been inserted into the data entries of data structure 600, the entries are sorted based on sketches 601. If a sketch includes multiple features or super features, the features or super features within each sketch are sorted pairwise (e.g., sort the entries based on the first super feature of each sketch, identify entries sharing that super feature, then sort the entries based on the second super feature, and so on). As a result, data chunks (which are identified by chunk IDs 602) having the same sketches are positioned adjacent to one another, which indicate or identify the similar data chunks. Similar data chunks can then be compressed and stored together as described above.

Given a set of super features (or sketches), there are several other ways to cluster them. According to one embodiment, as each data chunk is processed, processing logic looks up its first super feature $SF_0$ in a hash table of all $SF_0$ values seen thus far. If a match is found, the corresponding data chunk is associated with the first entry containing the $SF_0$. If no match is found, processing logic then iterates through each subsequent super features $SF_1$, $SF_2$, $SF_{n-1}$. If a match is found, the corresponding data chunk is associated with the earlier data chunk in the same fashion. If a data chunk does not match any of the previous data chunks based on its super feature, its super feature is inserted into each of the corresponding hash tables. Note that every super feature uses a different hash table, since a value of X for $SF_i$ has no relationship to value X for $SF_j$. This process is referred to herein as a greedy clustering approach.

Figure 6B:
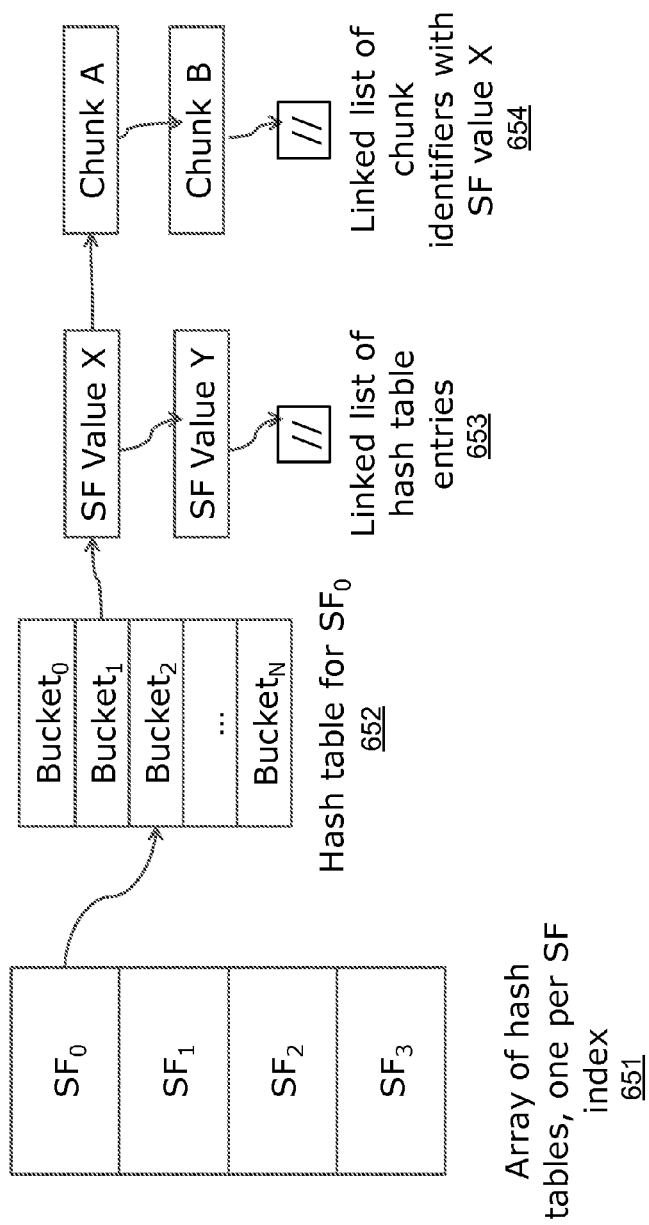
FIG. 6B is a block diagram illustrating an indexing process according to one embodiment of the invention.

FIG. 6B is a block diagram illustrating sorting data chunks using hash tables according to one embodiment of the invention. Referring to FIG. 6B, an array of hash tables 651 is utilized. Each hash table has buckets 652 which may have different actual super feature values 653. Each of the super feature values then links to a list of data chunks 654 sharing that super feature. A lookup into the hash table that does not yield existing data chunk(s) with the super feature value in question would mean that the data chunk whose SF is being looked up does not match any other data chunks in that SF up to this point. If it does not match any chunk in any of its SFs, it would be inserted in the hash tables for each SF.

If it matches one, it would be added to the list of chunks for the first one it matches, and its own SFs would not be inserted in the hash table.

In another embodiment, a super feature for a data chunk is inserted into the hash table even if the data chunk matches an earlier data chunk on a different super feature. That is, chunk A can be similar chunk B in one way, and chunk B can be similar to chunk C in another. In this scenario, it is desirable to have chunk A to be close to chunk B, but also chunk B to be close to chunk C. This process is referred to herein as a recursive clustering approach.

According to another embodiment, multiple passes may be performed over the metadata. During the first pass, processing logic counts a number of times a given value of a given super feature is encountered. Note that each super feature is associated with a different set of counters. One can think of this as a value of super feature being <index∥value>, with the concatenation making a value unique across super feature subscripts. During the second pass, processing logic identifies for each chunk how many other chunks it resembles in regard to each super feature. The data chunks are then sorted. Data chunks that overlap other data chunks in N super features are selected before data chunks that overlap other chunks in M super features (N>M). For each chunk, if it has not been moved to be with something it resembles, processing logic finds similar data chunks and move them to be located with this data chunk. The goal is to make the most commonly shared chunks the "base" chunks for others to be matched. This process is referred to as a guided clustering approach.

According to one embodiment, multiple features can be simultaneously matched and sorted. When multiple super features are used, processing logic finds data chunks that match on all of the super features first and then starts to find data chunks that match on fewer and fewer super features. The rationale is two blocks are likely more similar when they have more super features in common. As an example, when three super features ($SF_0$, $SF_1$, $SF_2$) are used for matching, several sorts could be done in total. Processing logic first identifies blocks that match on all three super features <0, 1, 2>, then those that match on two of them <0, 1>, <0, 2>, and <1, 2>, and finally those that only match on one super feature <0>, <1>, <2>. Note that after each sort, one block from each group of matching blocks is included in the following sorts to identify blocks that match on fewer super features. This process is referred to as a multi-feature matching approach. While we described an embodiment that uses sorting to find similar data chunks, a variety of indexing data structures could be used to perform the same functionality.

Figure 7:
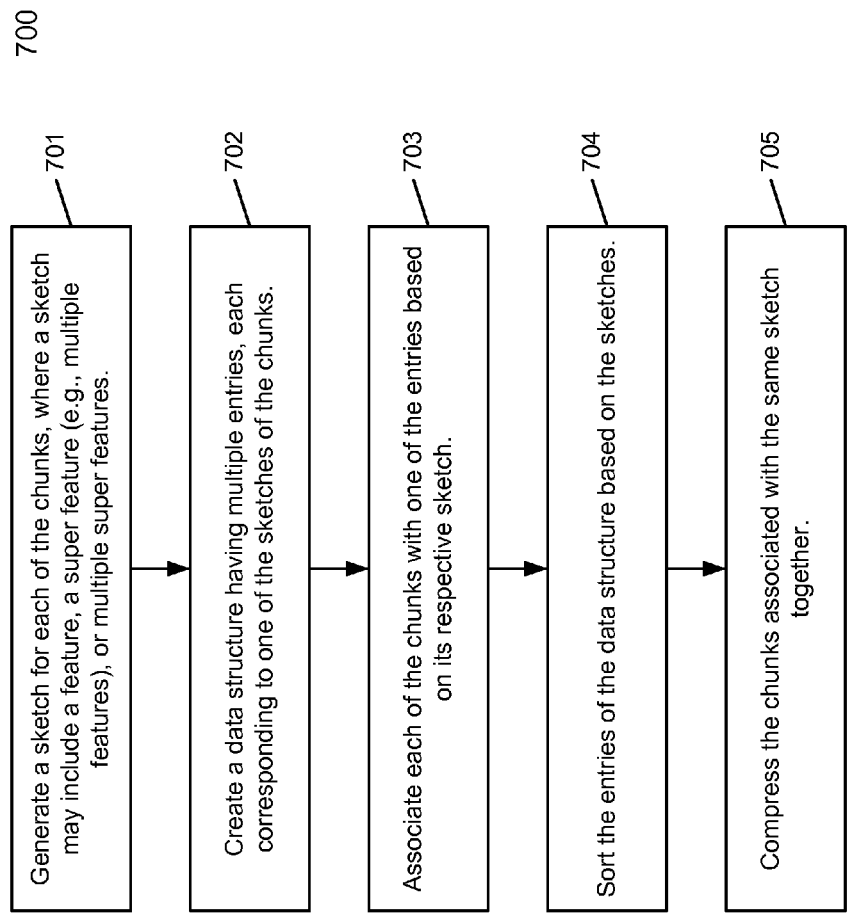
FIG. 7 is a flow diagram illustrating a method for determining similar data chunks according to one embodiment of the invention.

FIG. 7 is a flow diagram illustrating a method for determining similar data chunks according to one embodiment of the invention. Method 700 may be performed by a similarity detector as described above, which may be implemented in software, hardware, or a combination thereof. Referring to FIG. 7, at block 701, processing logic generates a sketch for each of the data chunks, which may be associated with a file. At block 702, a data structure is created having multiple entries, each entry corresponding to one of the sketches. At block 703, processing logic associates each of the data chunks with one of the entries based on their respective sketch. At block 704, the entries of the data structure are sorted based on the sketches. At block 705, the data chunks associated with the same sketch are compressed together.

Figure 8A:
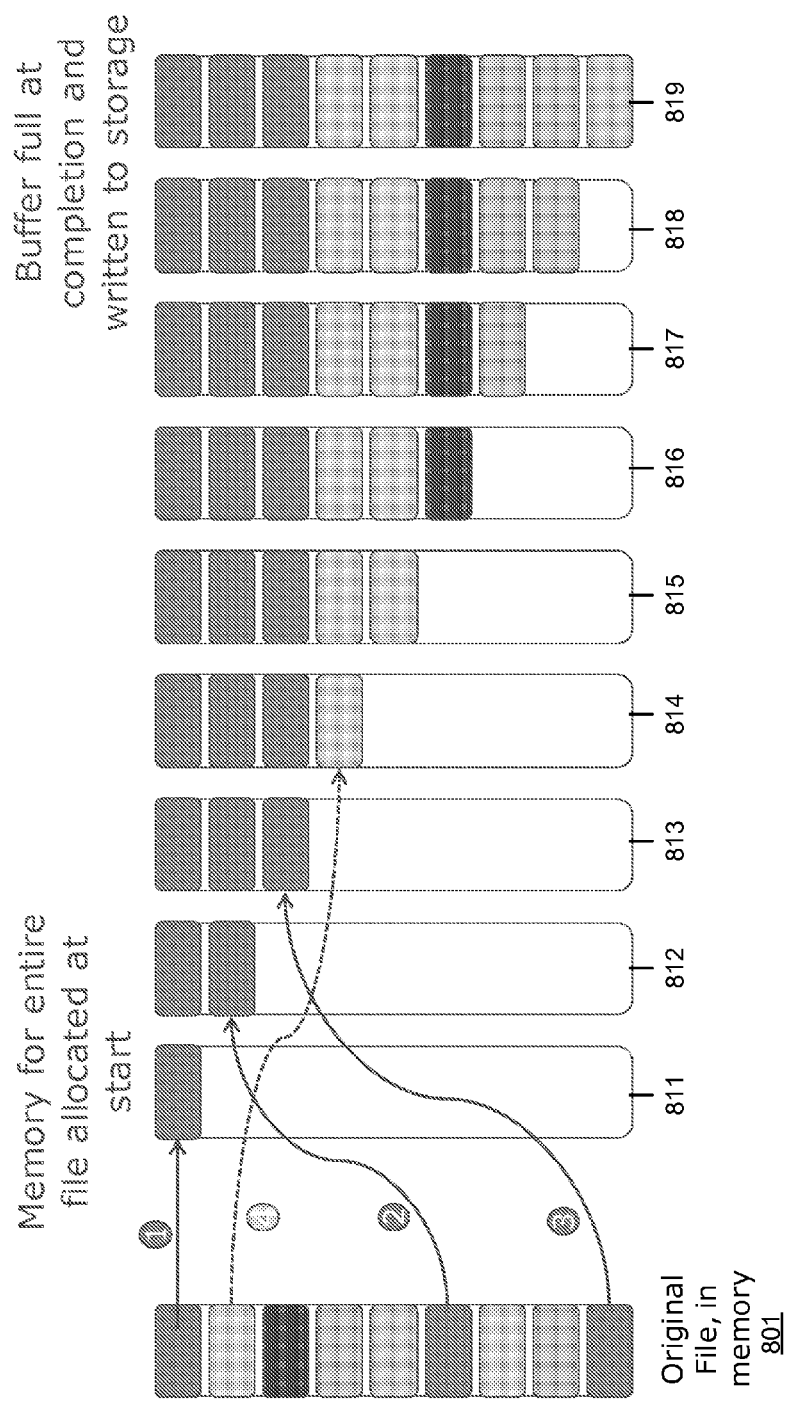
FIGS. 8A, 8B, and 8C are block diagrams illustrating reorganization of data chunks according to certain embodiments of the invention.
Figure 8B:
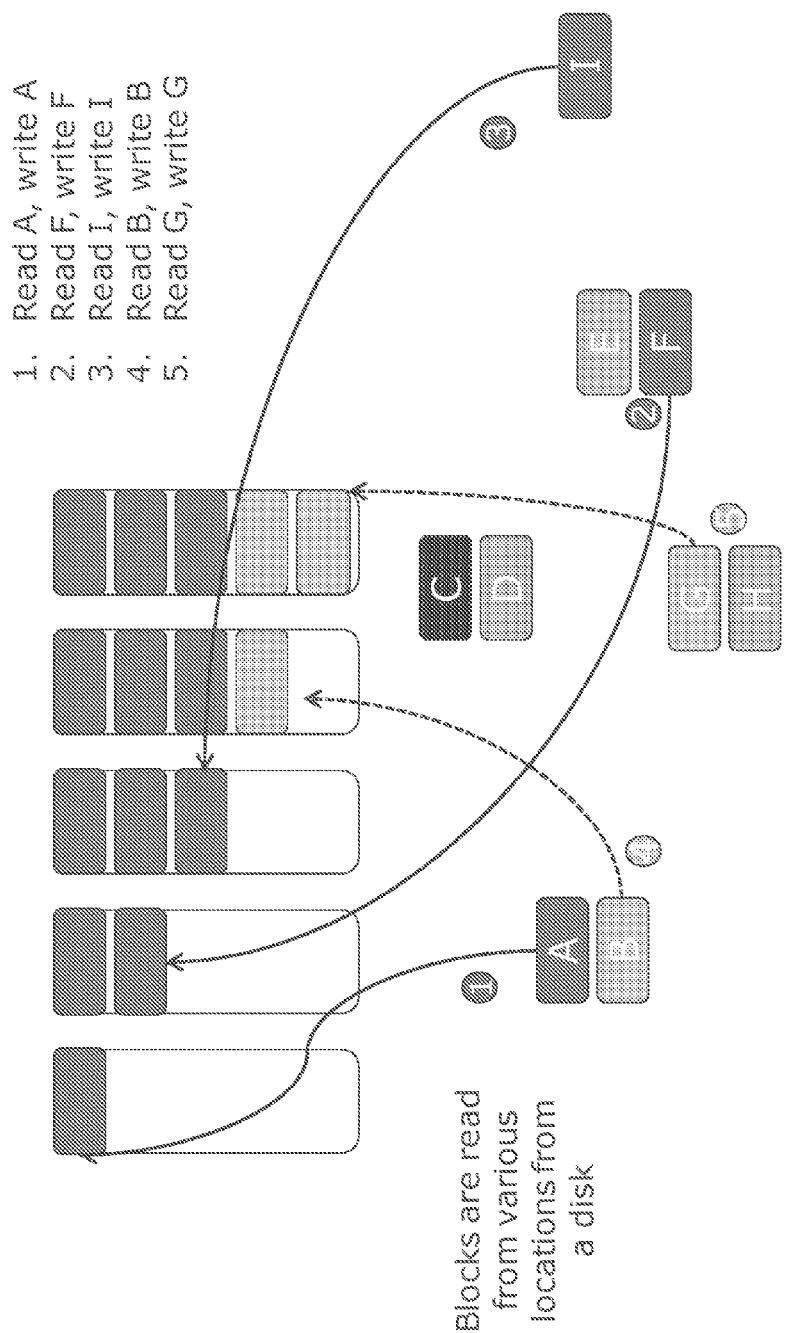
Figure 8C:
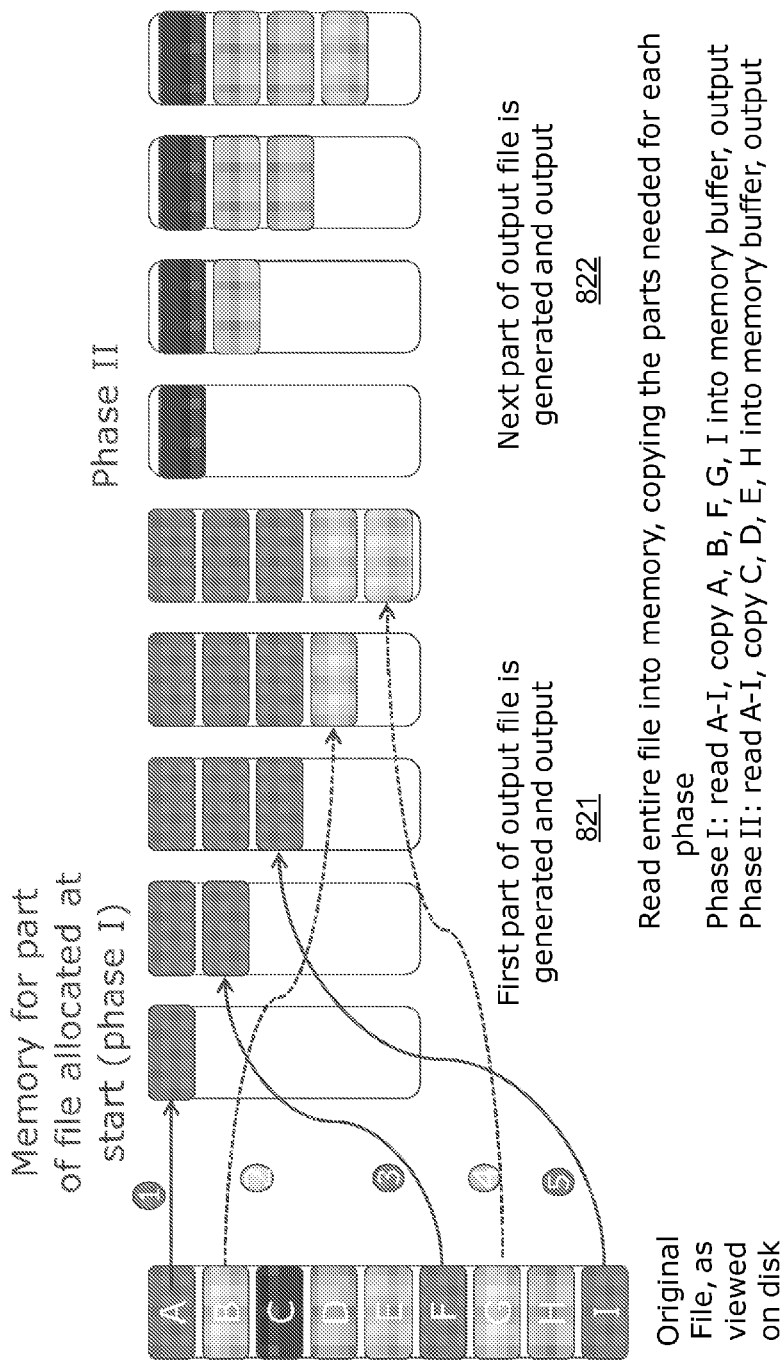

When organizing data chunks, according to one embodiment, if the data chunks can fit in the memory, all of the data chunks can be completely buffered in the memory and grouped into different buffers based on the similarity (e.g., sketches), as shown in FIG. 8A. In this example, referring to FIG. 8A, the system memory is large enough to maintain buffers 811-819 representing similar data chunks form file 801. In this example, it is assumed there are 9 non-duplicated sketches, each corresponding to one of the buffers. The memory is large enough to hold the data chunks as an input from file 801. Each of the chunks of file 801 is then moved or copied into one of the buffers based on its respective sketch. After all of the data chunks of file 801 have been populated into buffers 811-819 or any of the buffers 811-819 has enough similar data chunks stored therein (e.g., reaching a predetermined threshold), the data chunks of that buffer are then compressed and stored in the storage system. If all of the data chunks of the original file cannot fit in the memory, according to one embodiment, they can be processed in batches 821-822 as shown in FIGS. 8B and 8C, assuming the memory can only host up to certain number of buffers. In this example as shown in FIGS. 8B and 8C, multiple phases or passes are performed. During each phase, only a portion of the file is read into the buffers in memory that is only large enough to store a portion of the file.

Embodiments of Improving Data Compression of a Deduplicated Storage System

According to some embodiments, the techniques for improving data compression can be applied to the data chunks stored in a deduplicated storage system. Again, although the techniques are described herein in view of a deduplicated storage system, the techniques can also be applied to a general storage system. For example, data chunks that have been (deduplicated and) stored in a deduplicated storage system can be reorganized based on their similarity, compressed, and stored in the same or different storage area, such as a compression region or a container. For example, the data chunks may be reorganized within the same or different compression regions, containers, and/or storage units. The reorganization may be performed as a maintenance routine of a deduplicated storage system, such as, for example, garbage collection operations. Alternatively, the reorganization may be performed as part of data migration from one storage tier (e.g., active storage tier) to another storage tier (e.g., archive storage tier).

Figure 9:
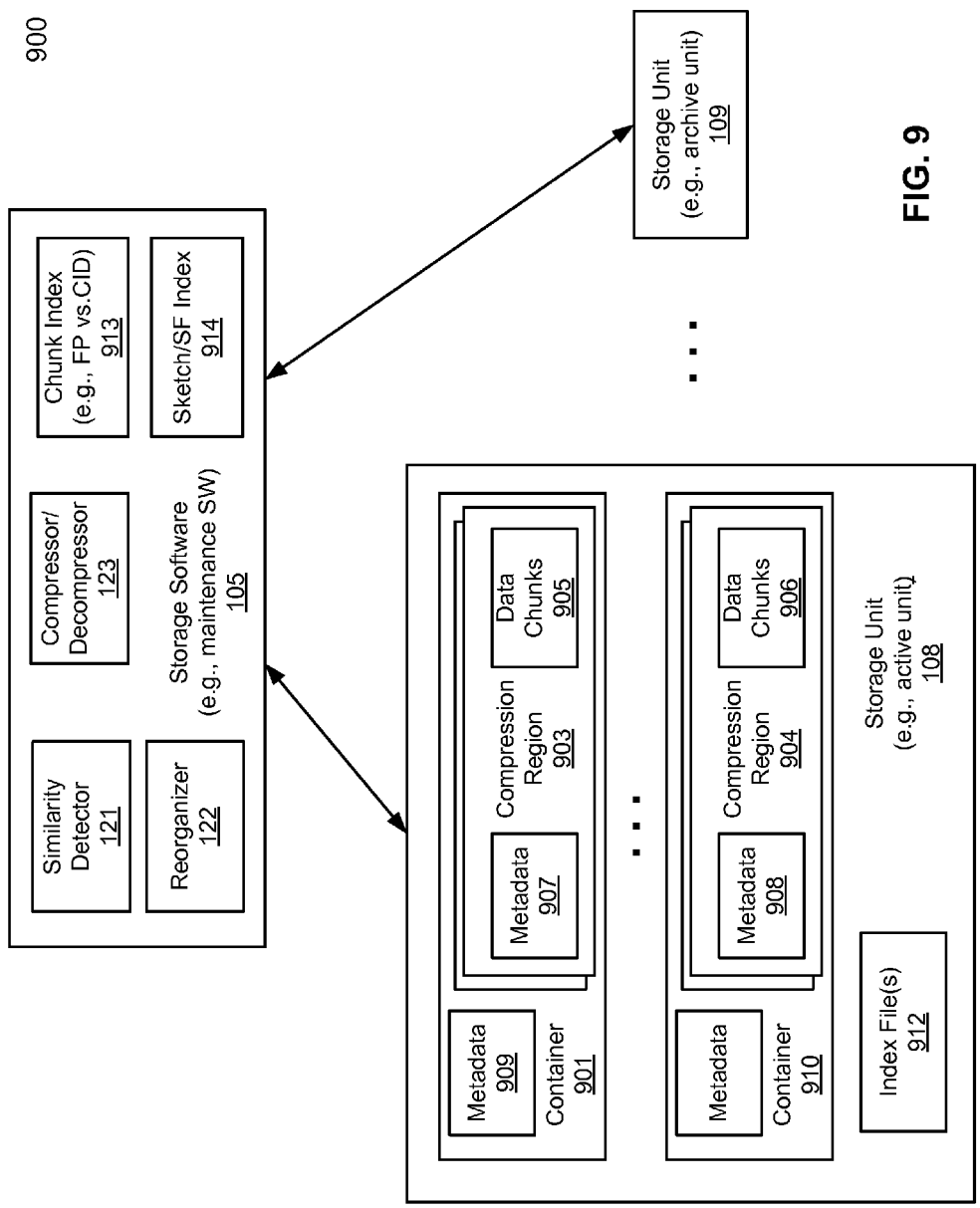
FIG. 9 is a block diagram illustrating a storage system according to one embodiment of the invention.

FIG. 9 is a block diagram illustrating a deduplicated storage system according to one embodiment of the invention. System 900 may be implemented as part of storage system 104 of FIG. 1. Referring to FIG. 9, similar to storage system 104 of FIG. 1, storage software 105, which may be part of a storage management system executed from a memory by a processor, is communicatively coupled to one or more storage units 108-109. Although not shown, storage units 108-109 may have the same or similar architecture or components operating therein. Each of the storage units 108-109 contains one or more containers (e.g., containers 901-902); each container contains one or more compression regions (e.g., compression regions 903-904) and their respective metadata (e.g., metadata 909-910); and each compression region contains one or more data chunks (e.g., data chunks 905-906) and their respective metadata (e.g., metadata 907-908). Each of the storage units 108-109 may further store one or more index files (e.g., index files 912) for mapping files with the deduplicated data chunks stored therein, which may be loaded in the memory as part of chunk index 913 and/or sketch/SF index 914. Each of the storage units 108-109 may further contain one or more file recipes (e.g., file recipes 911) for restoring a file after data chunks of the file have been reorganized as described above.

According to one embodiment, storage software 105 is configured to scan data chunks of a selected storage area, which can be a compression region, a container, and/or a storage unit. Based on the metadata of the scanned data chunks, similarity detector 121 is to detect the similarity of the data chunks. Reorganizer 122 is to reorganize the data chunks based on the similarity of the data chunks, such that similar data chunks can be compressed by compressor 123 and stored together in the storage system. The reorganization process can be performed amongst the data chunks within the same compression region (e.g., data chunks 905 of compression region 903), data chunks amongst different compression regions of the same container, data chunks amongst different containers (e.g., containers 903-904), and/or data chunks between two different storage units (e.g., storage units 108-109).

Figure 10:
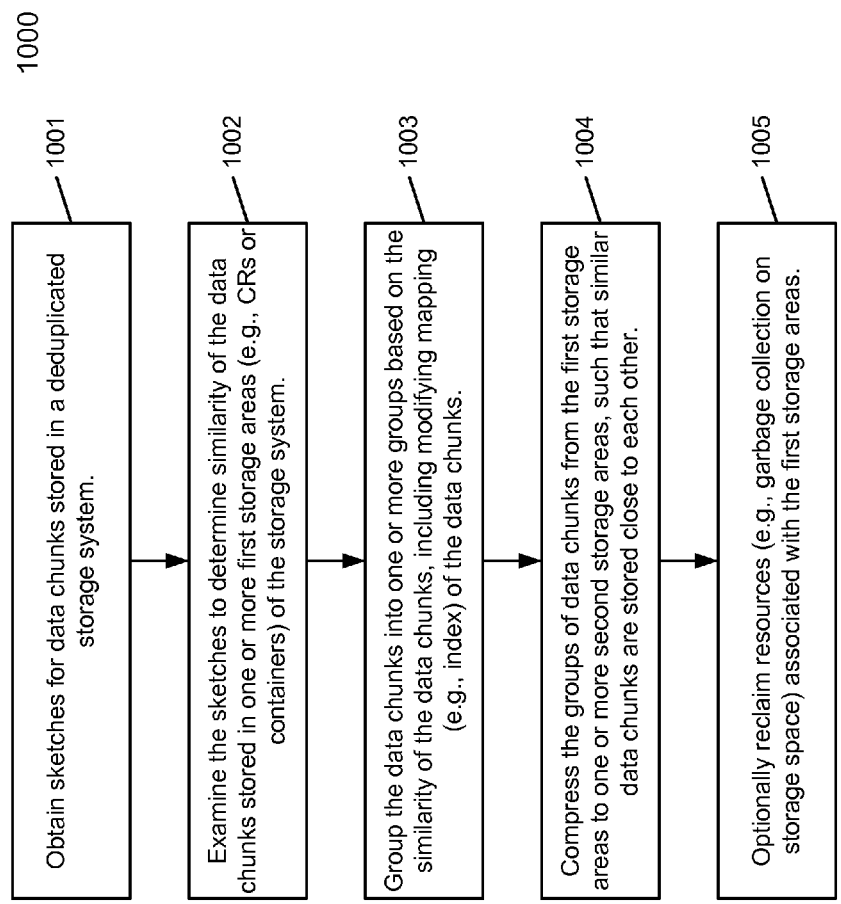
FIG. 10 is a flow diagram illustrating a method for improving data compression of a storage system according to one embodiment of the invention.

FIG. 10 is a flow diagram illustrating a method for improving data compression of a deduplicated storage system according to one embodiment of the invention. Method 1000 may be performed by system 900 of FIG. 9, which may be implemented as processing logic in software, hardware, or a combination thereof. Referring to FIG. 10, at block 1001, processing logic obtains sketches of data chunks that have been stored in a deduplicated storage system. At block 1002, the sketches are examined to determine the similarity of the data chunks stored in one or more first storage areas (e.g., compression regions or containers) of the storage system. At block 1003, the data chunks are grouped into one or more groups based on the similarity, which may modify the sequence order or locations of the data chunks. At block 1004, the groups of data chunks are then compressed and stored in one or more second storage areas, such that similar data chunks are compressed and stored close to each other. At block 1005, the resources associated with the first storage areas may be reclaimed.

Referring back to FIG. 9, for the purpose of illustration, in this example, storage software 105 scans metadata 907-908 of data chunks 905-906 to determine the similarity of data chunks 905-906. According to one embodiment, when data chunks 905-906 were stored in compression regions 903-904, a chunk similarity representation (or simply referred to as a chunk representation), such as a feature, a super feature (e.g., a combination of multiple features), or a sketch (e.g., a combination of multiple super features), of each data chunk may be generated and stored as part of metadata 907-908. For the purpose of determining the similarity of the data chunks 905-906, it is assumed sketches of the data chunks are utilized. Alternatively, the sketches of the data chunks 905-906 may be dynamically generated during the scanning.

The sketches of the scanned data chunks 905-906 may then be loaded into memory as part of sketch index 914. Sketch index 914 may include multiple entries, where each entry corresponds to one of the sketches of the data chunks. Each entry maps a particular sketch to a chunk ID (e.g., fingerprint) of the corresponding data chunk. In one embodiment, the entries of the sketch index 914 are sorted by similarity detector 121 based on the sketches, such that entries with the same sketch or the same sketch ID representing the same sketch are positioned adjacent to one another. In this scenario, data chunks associated with the same sketch are considered as similar data chunks. Based on the sorted entries of sketch index 914, the chunk IDs of the similar data chunks having the same sketch are identified from the entries. Alternatively, 1) the scanned sketches and corresponding chunk IDs can be stored in a stat file on disk and the stat file is sorted based on sketch values; 2) the scanned sketches can be inserted into a sketch index in memory; and 3) a set of memory efficient bloom filters can be configured or adapted to memorize the sketches. In the methods (1) and (3), a sketch index is not required in the memory. For example, after the stat file has been sorted based on the sketch values, each line of the file contains a list of chunk IDs of a batch matching a specific sketch value. Such information is sufficient to retrieve the similar chunks.

According to one embodiment, the similar data chunks are then retrieved by reorganizer 122 from their original storage areas (e.g., compression region) via chunk index 913 based on their chunk IDs, and decompressed by decompressor 123. In one embodiment, chunk index 913 includes multiple entries, each corresponding to one of the chunk IDs identifying one of the data chunks stored in the storage system 900, similar to the index data structure as shown in FIG. 6A. Each entry of chunk index 913 maps a particular chunk ID to a storage area ID (e.g., container ID or compression region ID) identifying a storage area in which the corresponding chunk is stored. Thereafter, the similar data chunks are then compressed by compressor 123 and stored together back in the storage system. In addition, chunk index 913 may be updated in view of the organization of the data chunks. The reorganized data chunks may be stored back in the original storage area or another storage area, either within the same or different compression regions, same or different containers, and/or same or different storage units. Note that chunk index 913 and sketch index 914 may be implemented in the same or separate data structures.

Figure 11A:
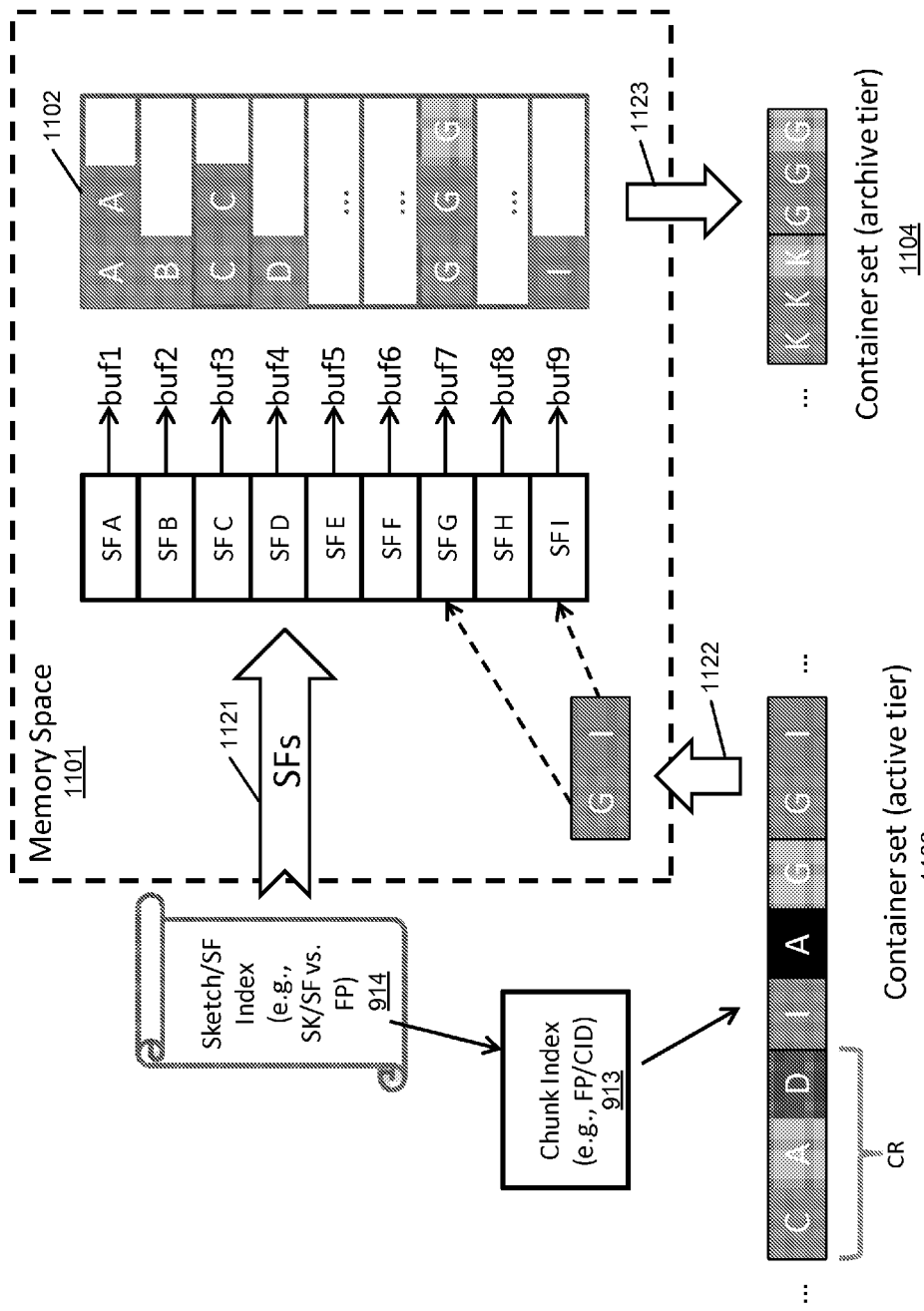
FIGS. 11A and 11B are block diagrams illustrating reorganization of data chunks according to certain embodiments of the invention.

FIG. 11A is a diagram illustrating a process for reorganizing data chunks of a storage system according to one embodiment of the invention. Referring to FIG. 11A, in this example, the data chunks of container 1103 are selected to be reorganized. The selection of the data chunks for reorganization may be performed based on a variety of data management policies. For example, an administrator or algorithm may select a set of containers, a set of files accessed within a predetermined period of time, a set of files associated with a particular host or client, a set of files of a particular type or types (e.g., file extensions), etc. Initially, sketches of the data chunks of container 1103 are obtained, either from container 1103 or dynamically generated based on scanning of the data chunks. A sketch index 914 is created as described above. Alternatively, the information maintained by index 914 may be implemented in a file. For example, each line of the file may store a list of chunk IDs that matches a certain sketch/FP value. For at least a selected portion of the sketches, buffers 1102 are allocated in memory space 1101 via path, one buffer for each of the selected sketches. In this example, buf1 is allocated for SF A; buf2 is allocated for SF B; buf3 is allocated for SF C, and so on.

Once the buffers 1102 have been allocated, for each of the sketches listed in sketch index 914, a chunk ID (e.g., fingerprint) is obtained from the corresponding entry. The chunk ID is then used to look up in chunk index 913 to locate a storage location in which the corresponding chunk is stored. Chunk index 913 also includes multiple entries, each corresponding to a deduplicated chunk identified by a chunk ID. Each entry of the chunk index 913 maps a chunk ID to a storage location ID identifying a storage location in which the corresponding chunk is stored. In this example, a storage location may be a container ID that identifies a container in which the data chunk is stored.

Figure 11B:
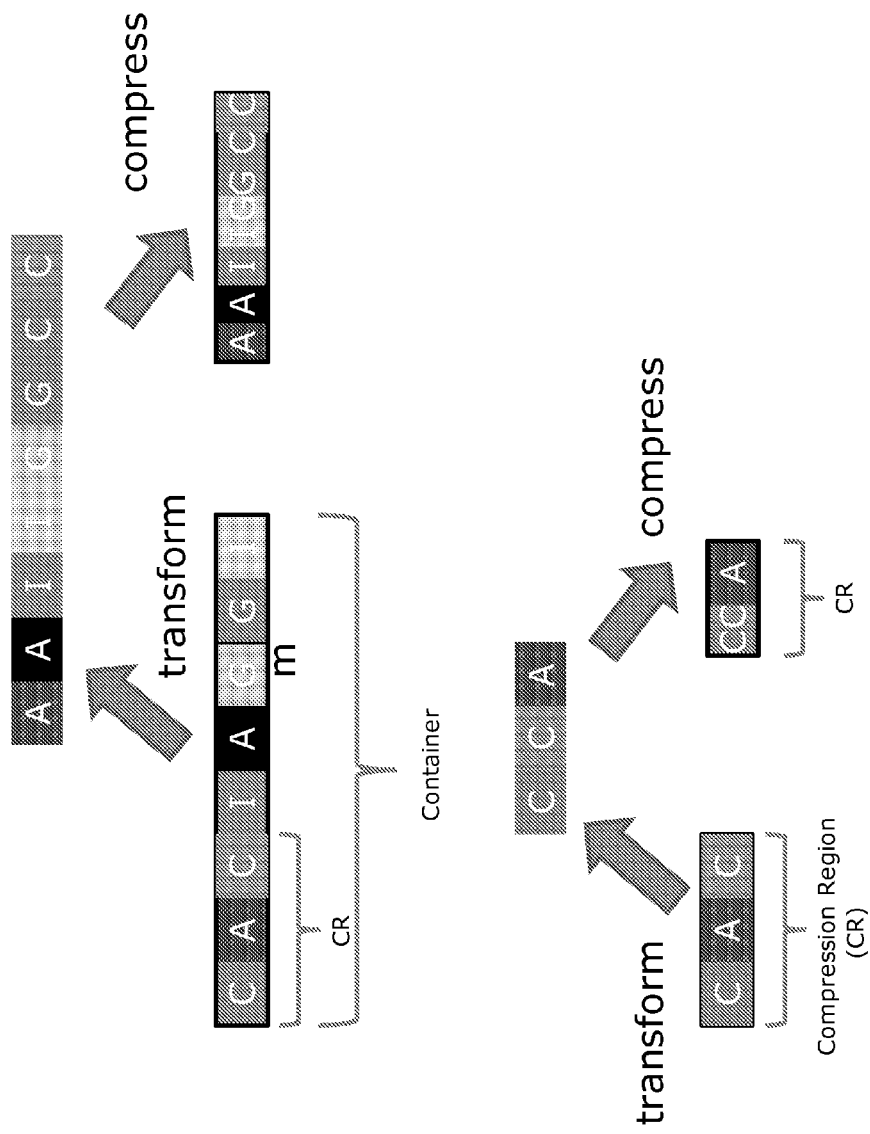

The data chunk is then retrieved from a storage location identified by the storage location ID. If the data chunks are stored in a compression region of a container, the entire compression region may be read, via path 1122, into the memory and the data chunk is obtained from the memory. The data chunk is associated or temporarily stored in one of the buffers 1102 that is associated with the sketch of the data chunk. This process is repeatedly performed for all of the data chunks listed in sketch index 914. Thus, each of the buffers 1102 stores similar data chunks, which is identified by the same associated sketch. Once any of the buffers 1102 contains enough (e.g., predetermined threshold) similar data chunks, the data chunks of the same buffer are then compressed and stored in storage area 1104 via path 1123. In one embodiment, each of the buffers 1102 corresponds to a compression region. When the content of a buffer is written, a new compression region is created, and chunks can be added to this buffer. Note that, as shown in FIG. 11B, storage area 1103 and storage area 1104 may be different compression regions within the same container. Alternatively, they may represent different containers of the same storage unit or different storage units, locally or remotely (e.g., data migration from an active storage unit to an archive storage unit).

When selecting which data chunks to place together for the purpose of improving data compression, there are multiple options. One of the primary goals is to move similar chunks from any location within the storage together. The advantage is higher compression, but it may require a large amount of data movement, which consumes I/O resources. An alternative approach is to only reorganize chunks that fall within a specified storage unit such as a container. In another approach, only data chunks within a file, within files written by the same host computer, or within files written within a certain time period are reorganized. An alternative approach is to only allow reorganization of chunks across two or a small set of containers. Each container would be represented by a sketch, similar containers would be selected, and chunks within those containers reorganized based on using sketches for each chunk. The advantage of this technique is to minimize the size of an index that maps from sketch to container instead of from sketch to chunk and to localize the churn (i.e. rewrite and cleaning) from the reorganization. An alternative approach is to only reorganize chunks that belong to files within certain temporal range, namely, the set of files being selected to move into the archive tier of a storage system.

Figure 12:
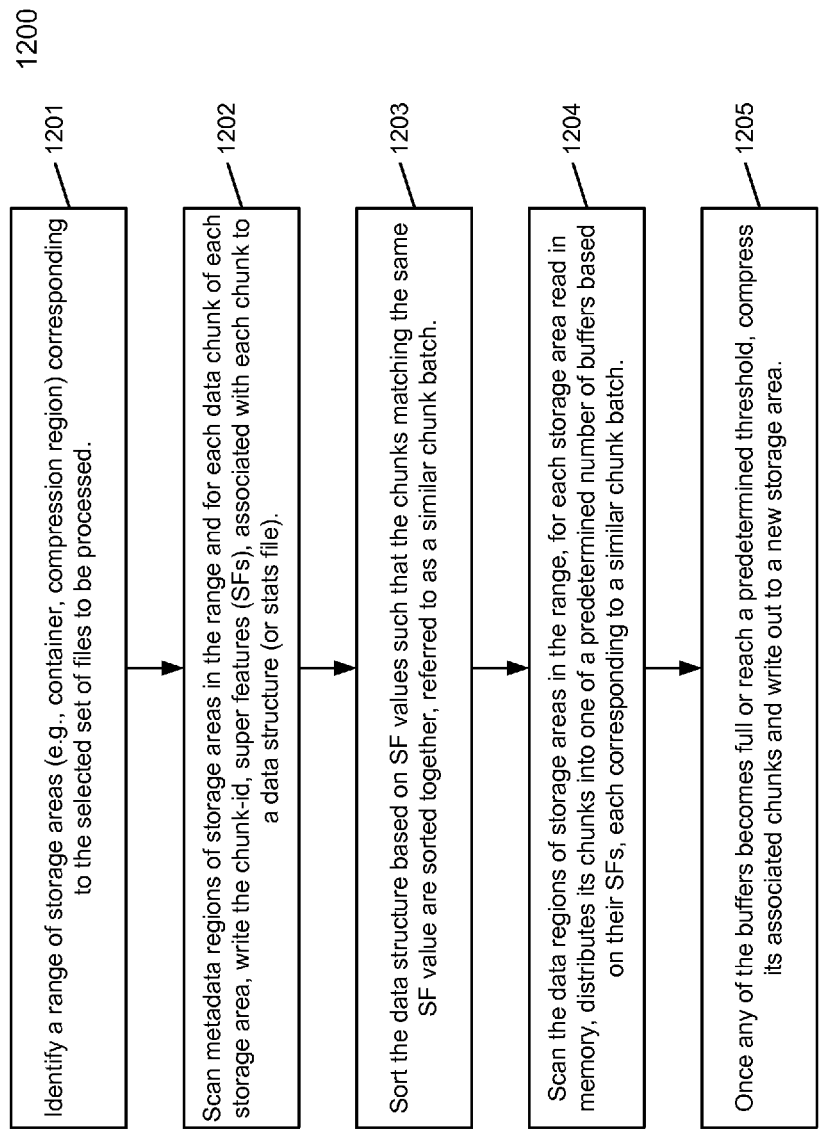
FIG. 12 is a flow diagram illustrating a method for improving data compression of a storage system according to one embodiment of the invention.

FIG. 12 is a flow diagram illustrating a method for improving data compression of a deduplicated storage system according to one embodiment of the invention. Method 1200 may be performed by the system as shown in FIGS. 11A and 11B. Referring to FIG. 12, at block 1201, processing logic identifies a range of storage areas, such as compression regions, containers, or storage devices, corresponding to a selected set of files to be processed. The set of files may be accessed within a particular period of time, a particular type of files, associated with a particular host, etc. At block 1202, processing logic scans metadata regions of the storage areas in the range to retrieve chunk similarity representations, such as features, super features, or sketches, and store them in a data structure in the memory or a file in a storage device. At block 1203, the data structure is sorted based on the chunk similarity representations such that the data chunks matching the same similarity representation are sorted together, referred to as a similar chunk batch. For each of similarity representations, a buffer is allocated in the memory. At block 1204, processing logic scans the data regions of the storage areas in the range. In this example, processing logic reads an entire compression region containing the identified data chunk(s) into the memory and distributes the chunks into one of the allocated buffers, each corresponding to a similar chunk batch. At block 1205, once any of the buffers becomes full or reaches a predetermined threshold, the associated data chunks are compressed and written out to a new storage area.

The techniques described above are referred to as offline reorganization processes which are performed after the data chunks have been stored in the storage system. An offline technique of reorganization can be utilized as data is moved from one storage tier to another. In such a scenario, reorganization happens when data is moved from backup storage to archive storage, though other tiers are possible. A standalone sketch index or a sketch index combined with filtering could be used with this approach. A policy for when to move data from one tier to another could be based on an administration policy, a schedule such as weekly movement, when a tier has reached a threshold capacity utilized, etc.

An alternative offline technique is to reorganize data within a tier as part of another operation that already reorganizes data. For example, garbage collection runs periodically to reclaim unused space. The garbage collection process within many log structured file systems will move and reorder data. It does this because some chunks may be dead and interspersed among live chunks. The live chunks must be copied to a new location to be saved. This is a natural time to reorganize chunks to achieve higher compression. When live chunks are copied forward we can group them based on similarity to achieve better compression. This can be done using the techniques discussed elsewhere in this patent such as by sketching and binning the live chunks, or by identifying similar containers and grouping those live chunks, or by identifying all live chunks to be copied and sorting their sketches to group them.

Besides implementing the compression technique in a storage system, the above techniques can be implemented as a standalone tool. Given a file, set of files, or directory, the tool creates chunks of data, calculates sketches, finds matching sketches, reorganizes chunks, writes out a recipe to reconstruct the file, and applies a standard compressor to achieve higher compression than otherwise possible. Consider it an alternative to standard compressors already used to reduce storage requirements. For many users, network bandwidth is a limiting factor when transferring data between machines as compared to computation and disk I/O. One could reorganize a file or set of files to achieve higher compression, transfer the data, and reconstruct the original file(s) at the target machine.

Embodiments of Improving Online Data Compression

According to some embodiments, the data chunk reorganization techniques can also be applied to online situations as new data chunks are received and to be stored in a storage system. In one embodiment, buckets are created either in memory or in flash storage device where each bucket represents a group of similar data chunks. This could be implemented as an index that maps from a sketch (or partial sketch) to a bucket large enough to hold multiple chunks. As a new chunk enters the system, the sketch is calculated, the appropriate bucket is selected, and the chunk is associated with or appended to the bucket. When the bucket has sufficient data, the associated data chunks are compressed, the compressed data are written to longer term storage, and the bucket is made available again either for the same sketch or a different sketch.

Figure 13:
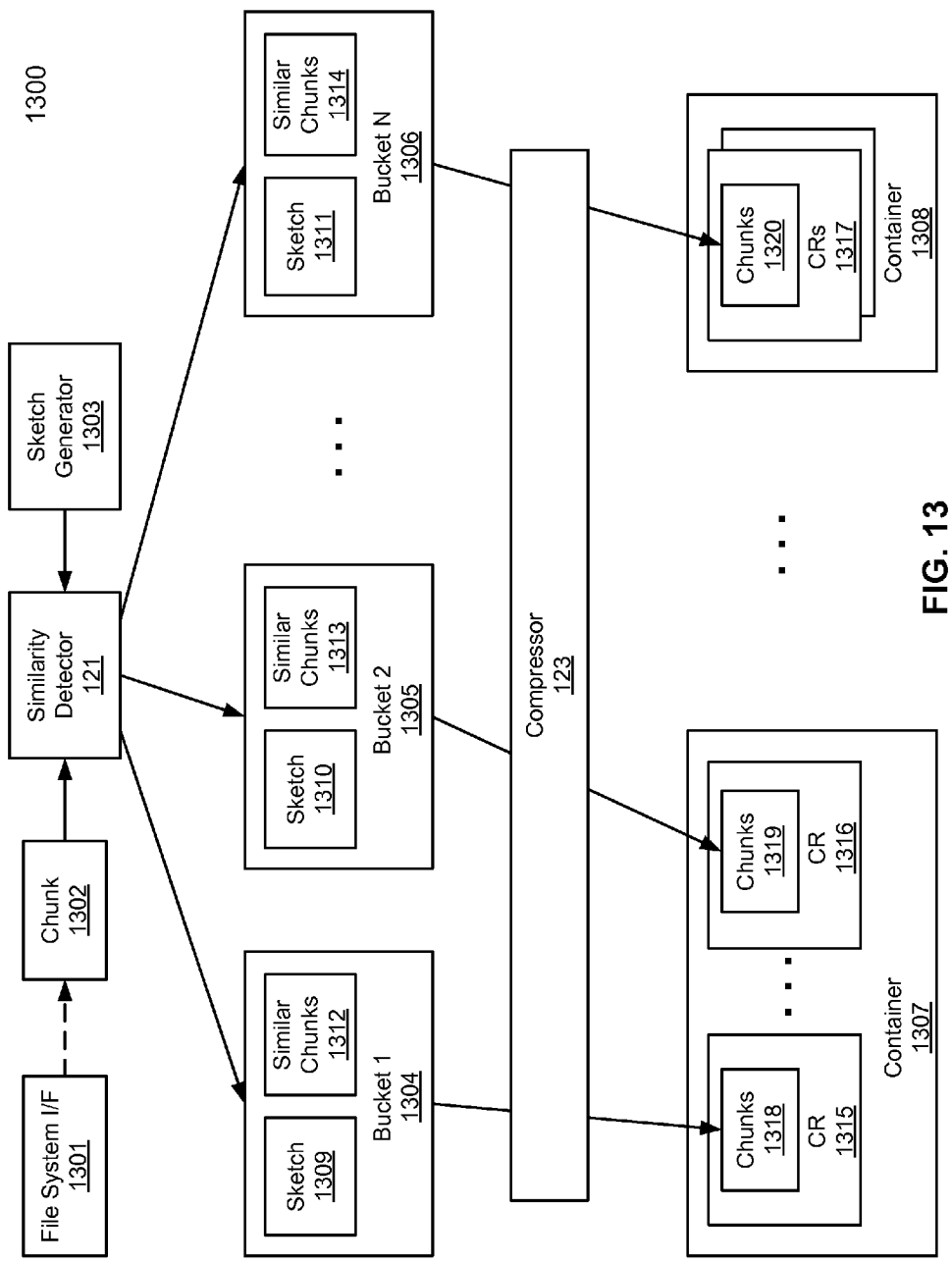
FIG. 13 is a block diagram illustrating a system for improving online data compression of a storage system according to one embodiment of the invention.

FIG. 13 is a block diagram illustrating a system for improving online data compression of a storage system according to one embodiment of the invention. System 1300 may be implemented as part of storage system 104 of FIG.

1. Referring to FIG. 13, storage system 1300 includes multiple storage areas, in this example, containers 1307-1308. Each of the containers 1307-1308 contains multiple compression regions such as compression regions 1315-1317. Each of the compression regions 1315-1317 stores multiple data chunks such as data chunks 1318-1320. In a deduplicated storage system, such data chunks are deduplicated data chunks.

When a file is received from file system interface 1301 to be stored storage system 1300, the file is partitioned into multiple data chunks 1302. According to one embodiment, prior to storing data chunks 1302 in any of containers 1307-1308, similarity detector 121 is to generate or invoke sketch generator 1303 to generate sketches (e.g., similarity representations) of data chunks 1302. For each of the generated sketches, a bucket (e.g., buckets 1304-1306) is allocated in the memory (if the memory is large enough) or an intermediate storage device such as a flash storage device. Each bucket represents or is associated with a buffer in the memory to temporarily store data chunks (e.g., data chunks 1312-1314) that have the same sketch (e.g., non-duplicated sketches 1309-1311) as the corresponding bucket. Each of data chunks 1302 is then reorganized (for example, by reorganizer 122 of FIG. 1) into one of buckets 1304-1306 as part of similar chunks 1312-1314 based on its sketch matching the one of the corresponding bucket. Once any of buckets 1304-1306 contains sufficient data chunks, the associated data chunks are then compressed and stored together in one of the compression regions 1315-1317. As a result, the compression rate is improved.

Figure 14:
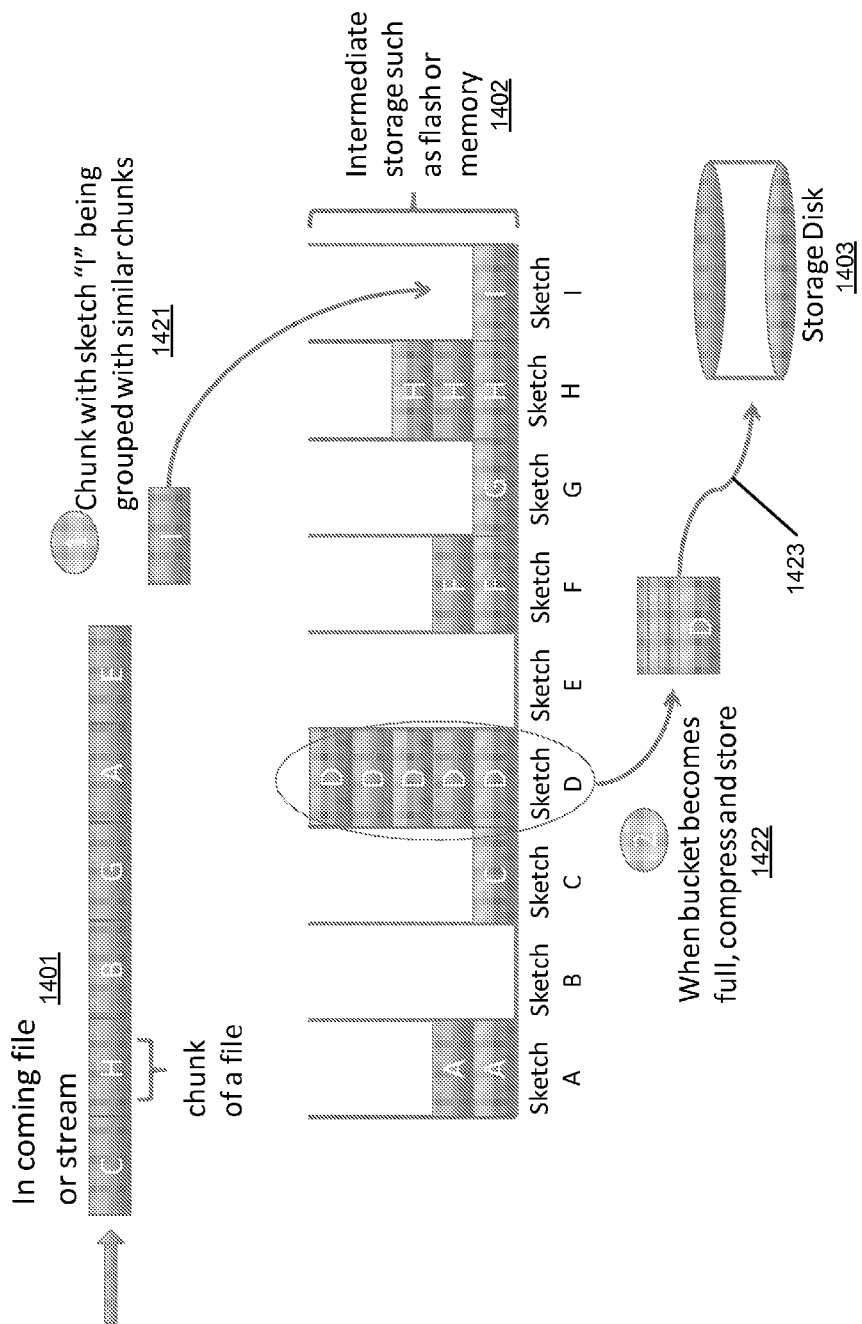
FIG. 14 is a block diagram illustrating an online process for improving data compression of a storage system according to one embodiment of the invention.

FIG. 14 is a block diagram illustrating an online process for improving data compression of a storage system according to one embodiment of the invention. Referring to FIG. 14, as a file 1401 streams in, it is partitioned into data chunks (either fixed or variable sized). For each chunk, a sketch is calculated. This could be done after deduplication if it is a deduplicating storage system. The sketch value is mapped to one of the temporary grouping buckets 1402 via transaction 1421. Buckets 1402 could be in memory or on a flash storage. The new chunk is added to its corresponding bucket. Adding to the bucket may entail writing the data with other data in the bucket or it may mean associating the data with the bucket, e.g. the bucket would contain a list of data chunks associated with it. When a bucket becomes full or reaches a predetermined threshold, the entries are compressed together via transaction 1422 and the compressed result is written via transaction 1423 to storage device 1403.

According to one embodiment, a bloom filter may be utilized to determine if any similar chunk has been seen before and the process does not start bucketing until at least one or N sketches have been seen. The incoming chunks may not actually need to be stored next to each other in temporary storage, they can be stored in a random order with a mapping that indicates which ones are part of a similar group. One advantage of this scheme is that read requests of data that have been recently written will likely be satisfied from the faster temporary storage such as flash disk or memory. Since data will be grouped on disk based on similarity, it may lose some stream-locality information, where stream-locality is the order written by the client. To overcome this one can write out chunk metadata in stream local units. In that way metadata will be grouped based on stream and file location and can help with deduplication or index lookup during reads.

Figure 15:
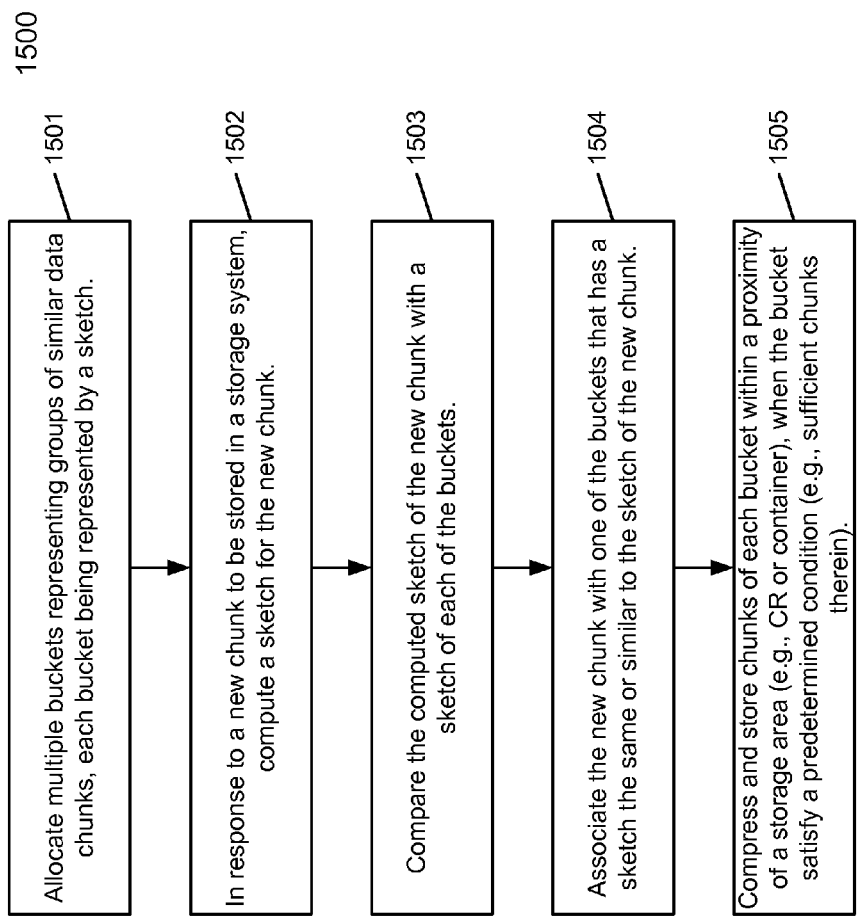
FIG. 15 is a flow diagram illustrating a method for improving data compression of a storage system according to one embodiment of the invention.

FIG. 15 is a flow diagram illustrating a method for improving data compression of a storage system according to one embodiment of the invention. Method 1500 may be performed by system 1300 of FIG. 13, which may be implemented in software, hardware, or a combination thereof. Referring to FIG. 15, at block 1501, processing logic allocates multiple buckets representing groups of similar data chunks. Each bucket is represented by a sketch (e.g., non-duplicated sketch). In response to a new chunk to be stored in a storage system, at block 1502, a sketch is determined for the new chunk, and the sketch of the new chunk is compared with the sketches of the buckets at block 1503. Once there is a match, the new chunk is associated with the matching bucket at block 1504. In some embodiments, a sketch is utilized with exactly as many possible values as buckets. In other embodiments, a sketch is associated with many more possible values than buckets. In such situation, processing logic manages which sketch values are currently mapped to buckets and possibly evicts a sketch bucket to add a bucket for a different sketch. The chunks of each bucket are then compressed and stored together in the storage system, once the bucket contains sufficient data.

Figure 16:
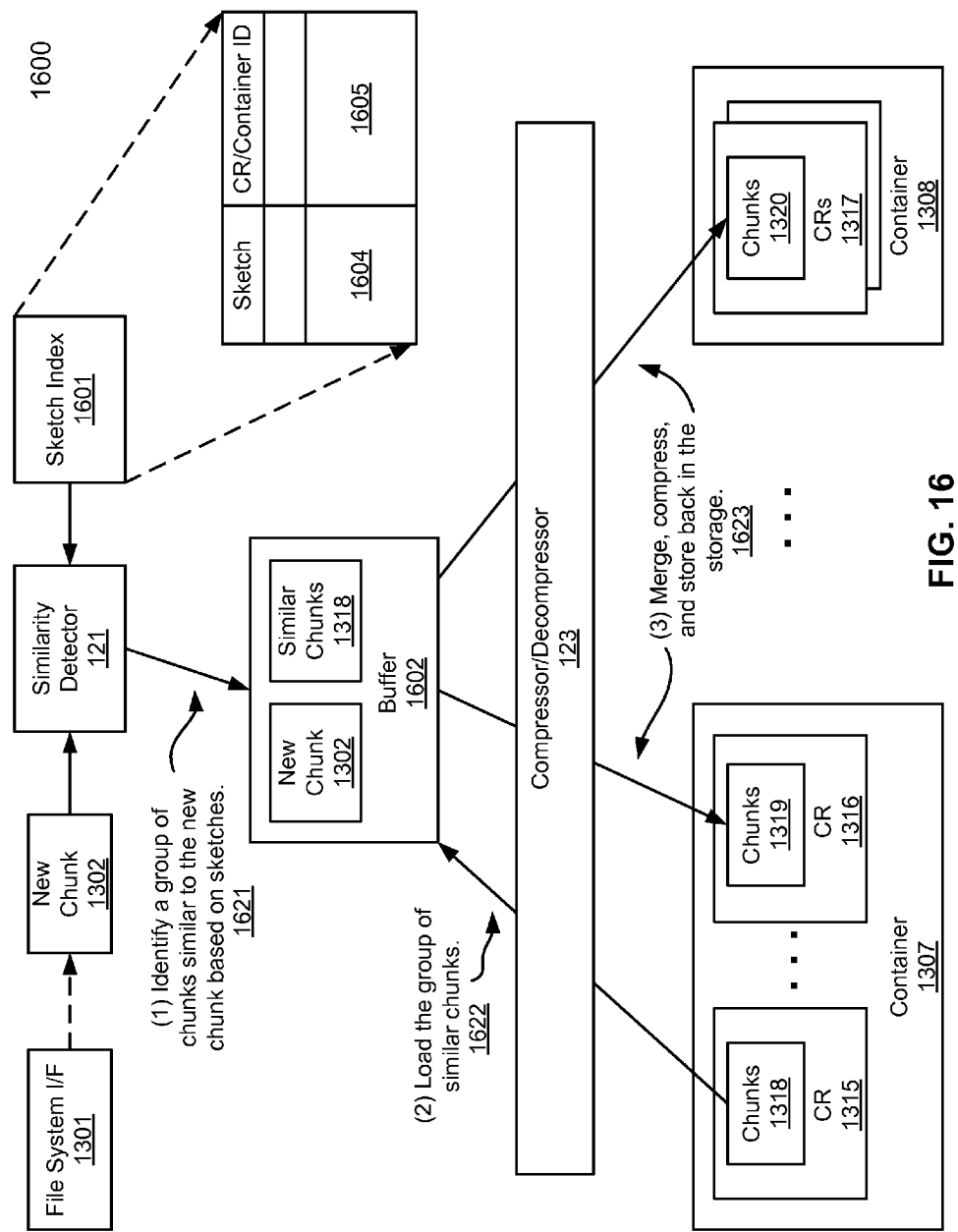
FIG. 16 is a block diagram illustrating a system for improving online data compression of a storage system according to another embodiment of the invention.

An alternative online technique finds similar chunks that have already been stored, reads them back to memory, groups them with the current chunk (e.g., new chunk), compresses the group, and writes them out together. FIG. 16 is a block diagram illustrating a system for improving online data compression of a storage system according to another embodiment of the invention. System 1600 may be implemented as part of storage system 104 of FIG. 1. Referring to FIG. 16, system 1600 maintains a sketch index 1601 having multiple entries. Each entry corresponds to one of the sketches 1604 and a storage location ID (e.g., container ID) 1605 identifying a storage location (e.g., containers 1307-1308) in which the corresponding data chunk is stored. The sketch index 1601 may be sorted based on the sketches 1604 as described above.

According to one embodiment, when a new chunk 1302 is received to be stored, a sketch of the new chunk is computed and used to look up in sketch index 1601 to identify, via transaction 1621, other chunks similar to the new chunk based on the matched sketch. The similar chunks are then retrieved from the storage via transaction 1622, in this example compression region 1315 of container 1307, and stored in buffer 1602. New chunk 1302 and existing, similar chunks 1318 are then compressed and stored back to the storage system, either in the same container (e.g., as part of compression region 1316) or different container (e.g., container 1308).

Figure 17:
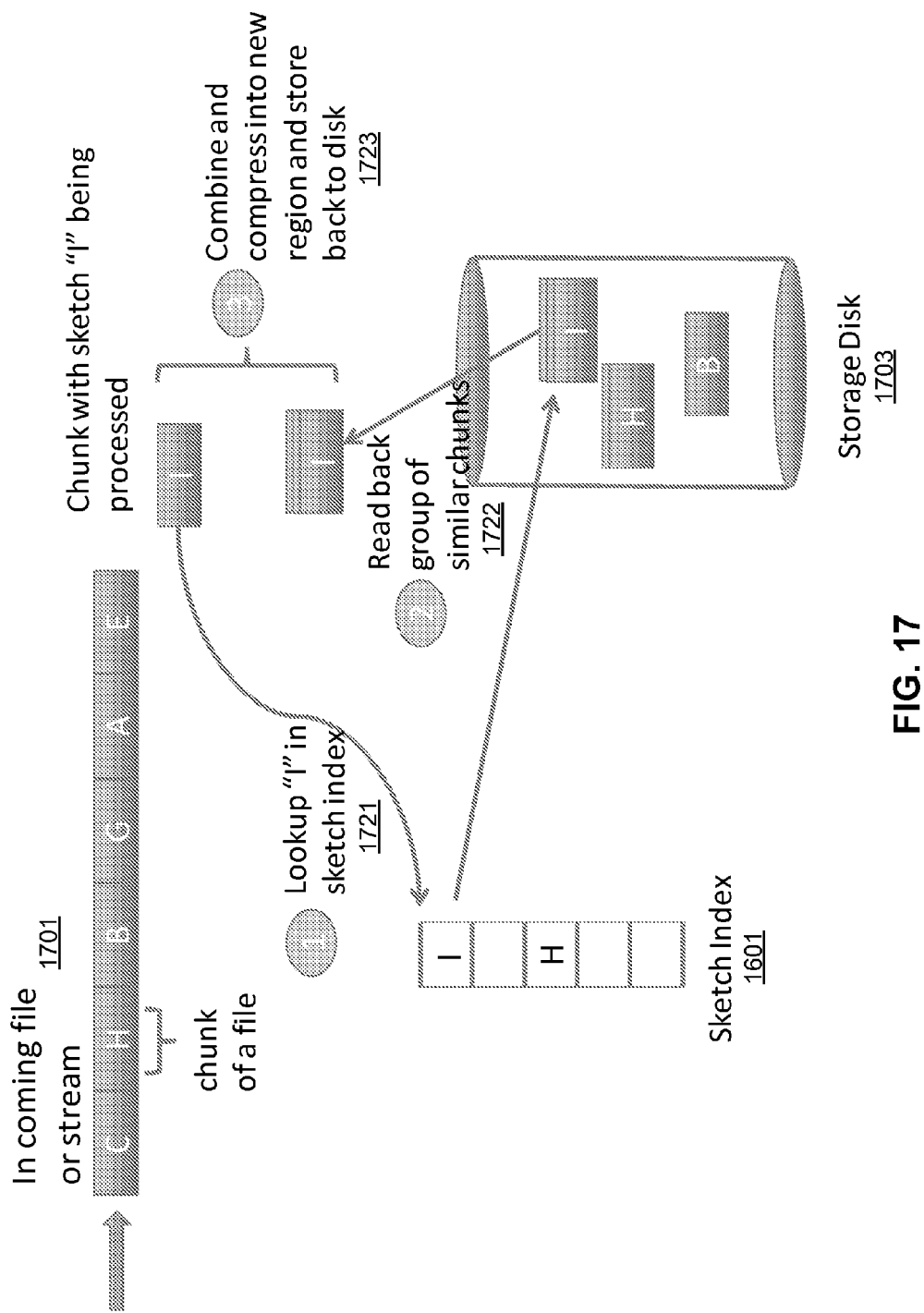
FIG. 17 is a block diagram illustrating an online process for improving data compression of a storage system according to another embodiment of the invention.

FIG. 17 is a block diagram illustrating an online process for improving data compression of a storage system according to another embodiment of the invention. Referring to FIG. 17, as file 1701 streams in, and it is segmented into chunks. For each chunk, processing logic calculates a sketch for each chunk, in this example chunk I. Processing logic looks up based on the sketch in sketch index 1601, via transaction 1721, to determine if similar chunks exist on the storage system, in this example, storage disk 1703. If similar chunks exist, processing logic reads a compressed group of data chunks into memory via transaction 1722. The new chunk is added or merged with the previously compressed group. The merged group is recompressed and written out to the storage system via transaction 1723. Over time the compressed regions will be more and more packed with a bunch of similar items, i.e. a bunch of items all with sketch "I" in the same compression region.

Figure 18:
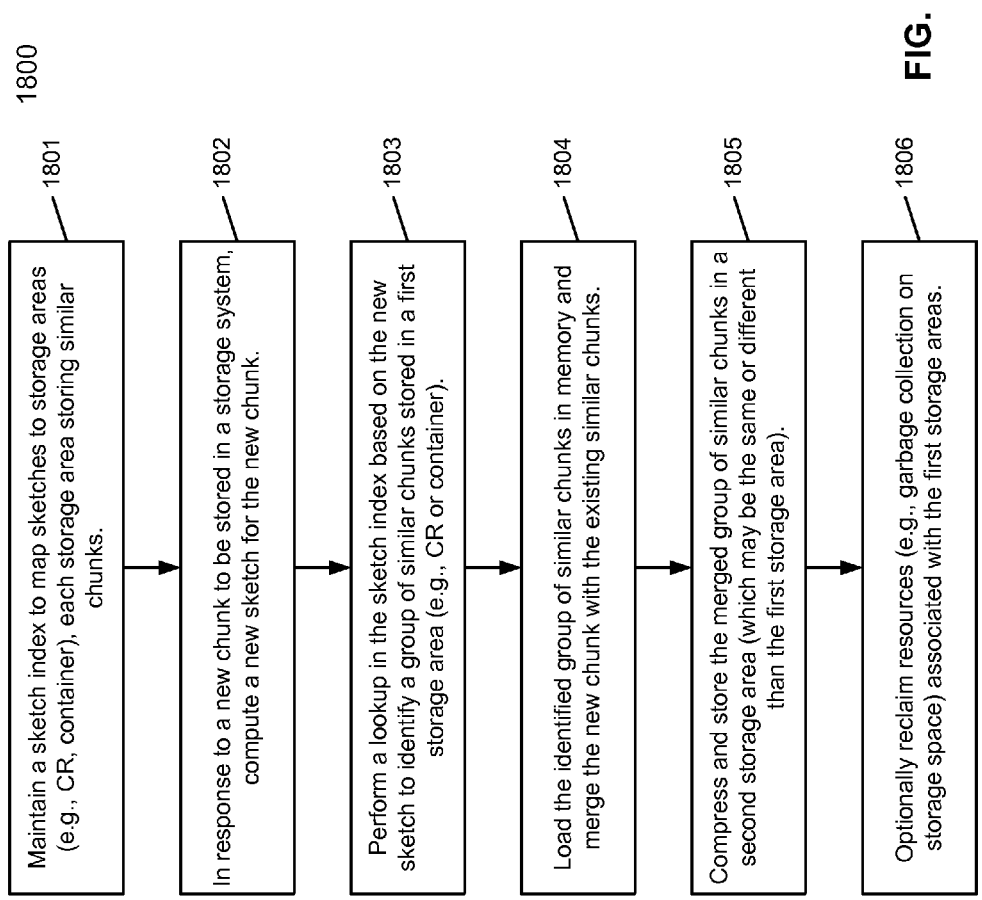
FIG. 18 is a flow diagram illustrating a method for improving online compression of a storage system according to another embodiment of the invention.

FIG. 18 is a flow diagram illustrating a method for improving online compression of a storage system according to another embodiment of the invention. Method 1800 may be performed by system 1600 of FIG. 16, which may be performed by processing logic in software, hardware, or a combination thereof. Referring to FIG. 18, at block 1801, a sketch index is maintained to map sketches to storage areas of a storage system. Each of the storage area may store similar data chunks which are represented by a particular sketch. At block 1802, in response to a new data chunk to be stored in the storage system, a new sketch is computed for the new data chunk. At block 1803, processing logic looks up in the sketch index based on the new sketch to determine a storage area that contains the similar data chunks. At block 1804, the data chunks of the determined storage area are loaded into the memory and the new chunk is merged with the existing similar data chunks. At block 1805, the merged data chunks are then compressed and stored back to the storage system, either in the same storage area or a different storage area. Alternatively, at block 1806, if the merged data chunks are written to a different storage area, then the earlier storage area (e.g., first storage area) can be erased or reclaimed to be used for future storage needs.

Note that the above online approaches and offline approaches may be utilized in combination. As a hybrid of online and offline, one could gather information about chunk similarity or container similarity online and reorganize data chunks offline.

Embodiments of Balancing Compression and Read Performance of a Storage System

Reorganizing data can improve compression but it tends to slow down the read-back of such data because it is no longer sequentially written to the storage. As an example, in a standard storage system, a file may be written out in mostly consecutive positions on a disk. Applying the reorganization described above changes the layout such that bytes that a user will normally access consecutively are actually stored in non-consecutive locations. Reading a file may require more disk seeks than otherwise necessary. Note that, in some embodiments, chunks compressed together form a compression region that has to be read in its entirety and decompressed to get back a desired chunk. It is not possible to simply read back one chunk that is towards the end of a compression region.

In a typical storage system with compression, each compression region has a maximum size. To access any data in a compression region, the system has to retrieve and uncompress the entire compression region, which is then cached in memory until replaced in the cache. Data that will be accessed together should be stored together, but the compression techniques described above suggest storing similar data chunks together to improve the data compression rate, instead of based on access patterns.

Figure 19A:
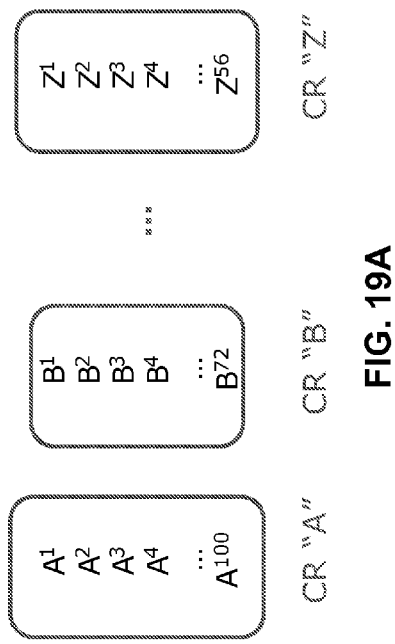
FIGS. 19A and 19B are block diagrams illustrating reorganization of data chunks according to certain embodiments of the invention.

For example, as shown in FIG. 19A, similar data chunks are compressed and stored together. In this example, similar chunks A1, A2, . . . A100 are compressed and stored in compression region A. Similar chunks B1, B2, . . . B72 are compressed and stored in compression region B. Similar chunks Z1, Z2, . . . Z56 are compressed and stored in compression region Z, and so on. These similar chunks may present different versions of similar content such as different versions of a backup file. To read a file containing chunks A100, B72, . . . , and Z56, the system has to read each of the compression regions A to Z, which requires a large number of I/O operations. The read performance tends to be lower in this scenario than in a system without such reorganization.

Figure 19B:
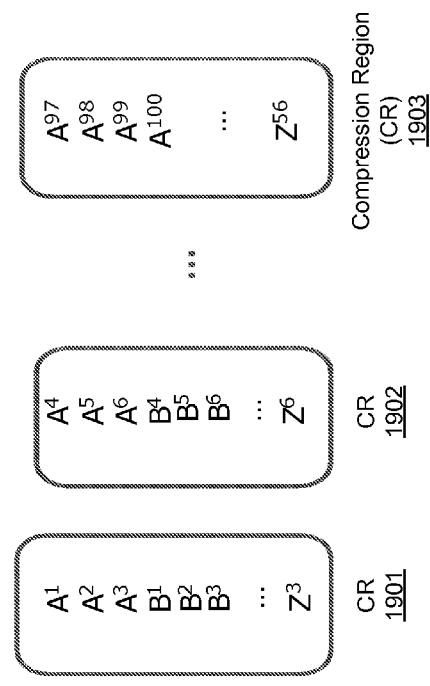

According to one embodiment, the number of similar chunks written together is limited to prevent filling a compression region or container with non-consecutive data (i.e., chunks that are dissimilar but likely accessed together with the similar data chunks are stored in the same compression region or container). In this fashion as shown in FIG. 19B, reading a single compression region could load an in-memory cache with a few versions of multiple chunks rather than a large number of versions of a single chunk. Referring to FIG. 19B, to read a file containing chunks A100, B72, . . . Z56, a single read from the compression region 1903 may be enough, without having to access CRs 1901-1902.

Figure 20:
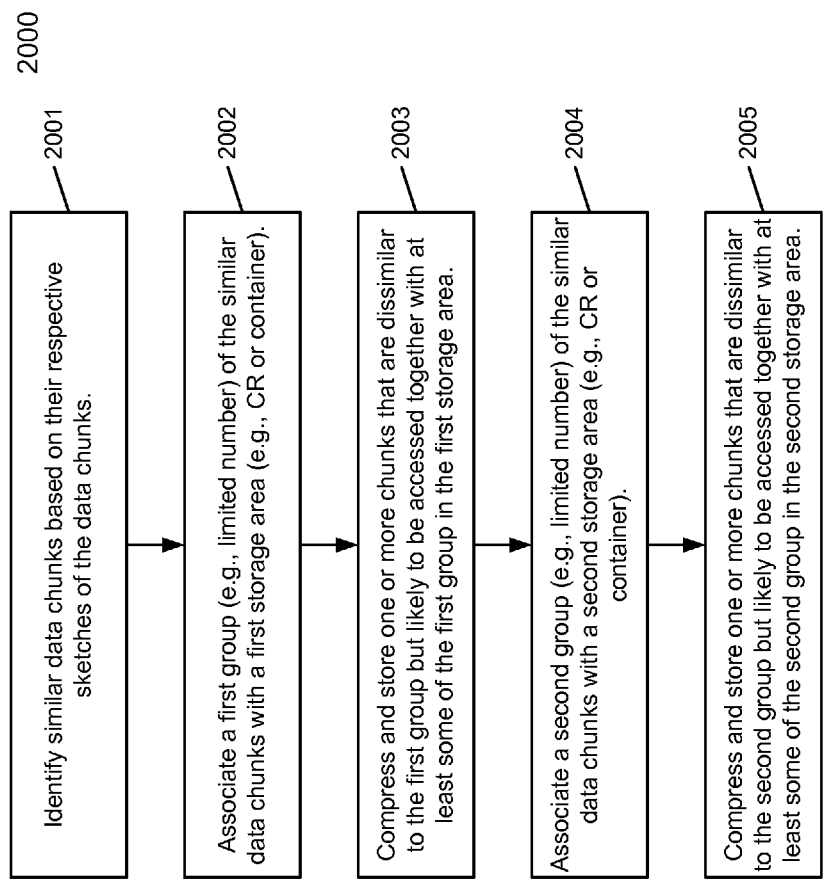
FIG. 20 is a flow diagram illustrating a method for balancing data compression and read performance according to one embodiment of the invention.

FIG. 20 is a flow diagram illustrating a method for balancing data compression and read performance according to one embodiment of the invention. Method 2000 may be performed by processing logic in software, hardware, or a combination thereof. Referring to FIG. 20, at block 2001, similar data chunks are identified based on their respective sketches. At block 2002, processing logic associates a first group (up to a limited number) of similar data chunks with a first storage area (e.g., compression region or container). At block 2003, processing logic compresses and stores in the first storage area a first group of similar chunks together with one or more chunks, which are not similar to the first portion, but would likely be accessed together with at least some of the first group of the similar chunks. At block 2004, processing logic associates a second group of the similar data chunks with a second storage area. At block 2005, processing logic compresses and stores in the second storage area a second group of similar chunks together with one or more chunks, which are not similar to the second group, but would likely be accessed together with at least some of the second group of the similar chunks.

According to another embodiment, to improve read locality of the data that are most likely to be read, data can be laid out in a fashion that is largely sequential for a specific file, for instance the most recent full backup written to the system. Similar data can be interspersed with the final version, but only "older" data would be moved out of its original order due to similarity groupings. The newest version would be more sequential. The rationale behind this embodiment is that in the event that several generations of a backup are copied together, the read performance of the most recent generation is more important than earlier generations because the most recent generation is more likely accessed again in the future compared to its older counterparts.

Figure 21:
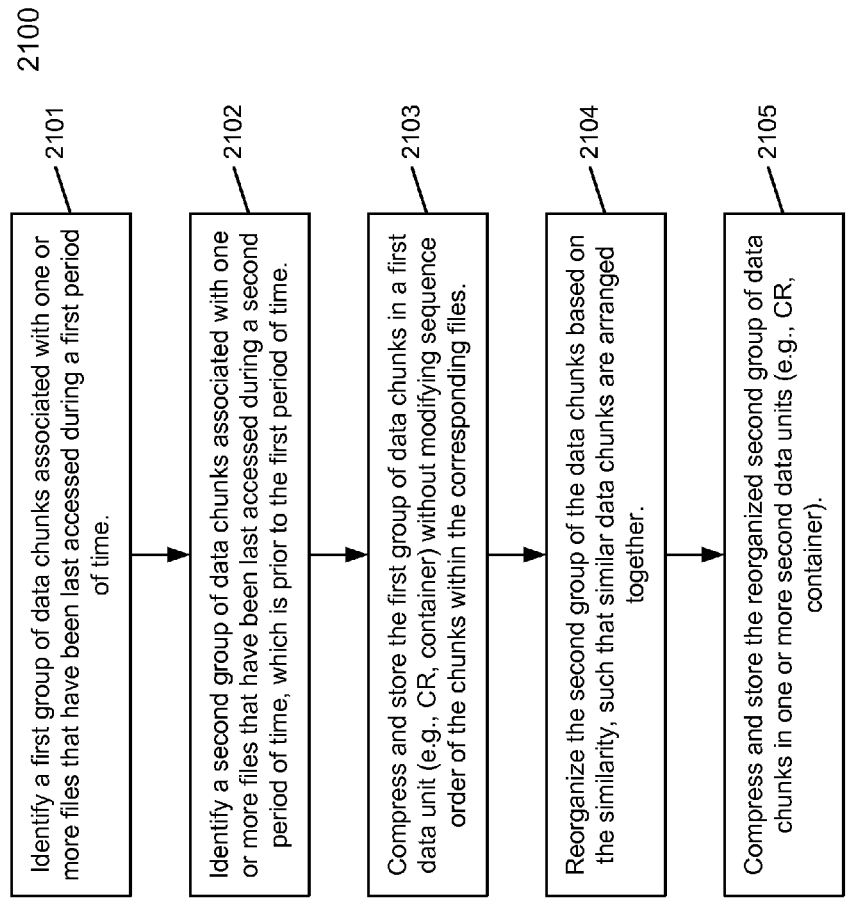
FIG. 21 is a flow diagram illustrating a method for balancing data compression and read performance according to another embodiment of the invention.

FIG. 21 is a flow diagram illustrating a method for balancing data compression and read performance according to another embodiment of the invention. Method 2100 may be performed by processing logic in software, hardware, or a combination thereof. Referring to FIG. 21, at block 2101, processing logic identifies a first group of data chunks associated with one or more files that have been last accessed during a first period of time. At block 2102, processing logic identifies a second group of data chunks associated with one or more files that have been last accessed during a second period of time. The second period of time is prior to the first period of time chronologically. At block 2103, processing logic compresses and stores the first group of data chunks in one or more first data units (e.g., compression regions, containers) without reorganizing the data chunks of the first files. At block 2104, processing logic reorganizes the data chunks of the second group based on their similarity, such that similar data chunks are arranged adjacent to each other. At block 2105, the reorganized data chunks are then compressed and stored in one or more second data units.

According to one embodiment, even though some similar data chunks are compressed and stored together in a storage area such as a compression region or container, if a data chunk stored in one storage area and another data chunk stored in another storage area are accessed more frequently, they may be reorganized again to be stored together in the same storage area, regardless whether they are similar, to improve the read performance. In such a scenario, the previously reorganization of data chunks may be effectively "undone" in favor of read performance.

Embodiments of Efficiently Indexing Similar Data Segments of a Storage System

There are various approaches to index the similarity representations such as sketches and the data chunks for the purpose of improving data compression. According to one embodiment, the first approach is to create a full index that maps from sketch to chunk. This index could be a hash table, b-tree, or any other indexing data structure. For small data sets, it may be possible to keep the index in memory, but for large storage systems, the index would likely have to exist at least partially in secondary storage such as a hard drive or flash storage.

According to another embodiment, an alternative approach is that the deduplication system has a full index mapping from fingerprint to container, sketches can be added to containers, and sketches are loaded into the cache when a container is accessed during deduplication. An alternative embodiment is to generate a sketch per container and keep this smaller index in memory or on disk. The sketch per container could be created in several ways including: selecting the maximum chunk super-feature within the container, selecting the minimum chunk super-feature, or selecting the chunk super-features that match a predefined pattern. The container sketch would consist of one or more selected super-features for the container.

Another alternative approach is to avoid creating a persistent index and instead find matching chunks at a later time. Instead of creating an index, we simply place the entry <sketch, chunk_ID> in a file, where chunk_ID could be a fingerprint or location in the storage system. Then sort the file by sketch such that matching sketches are sorted together. This is effectively a sorted array, and it replaces the need for an index. Matching sketches implies that multiple chunks share the same sketch. Instead of creating a full index of each sketch, another embodiment uses a memory efficient filter to filter through all the sketches and memorize sketches that match multiple chunks. Additional space/time overhead would be paid to group the chunks that match each filtered sketch. Comparing to the full sketch index approach, this approach decouples the similar sketch discovery and chunk grouping in order to reduce the index size. While this technique may miss some similar chunks due to the filter inaccuracy, in practice it is able to capture the major fraction of similar chunks.

Figure 22:
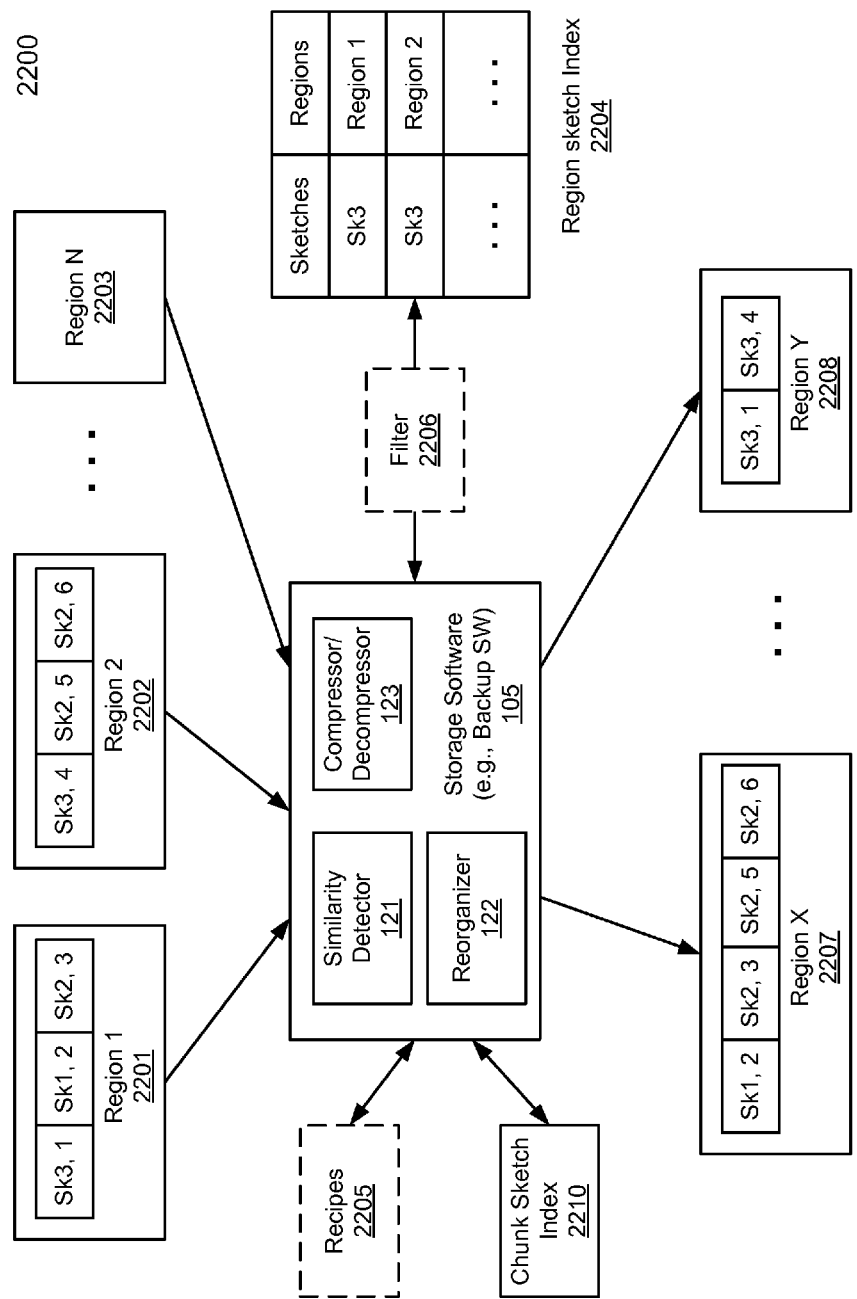
FIG. 22 is a block diagram illustrating a storage system with an efficient indexing scheme according to one embodiment of the invention.

FIG. 22 is a block diagram illustrating a storage system with an indexing scheme according to one embodiment of the invention. Referring to FIG. 22, in this example, it is assumed storage system 2200 includes storage regions 2201-2203. A storage region may be a compression region or a container. Typically, storage system 2200 includes many storage regions and it is impractical to maintain sketches for all regions at a time for the purpose of reorganizing the data chunks stored therein, because there is a limited amount of memory available in storage system 2200. The reorganization of data chunks may be performed on the storage regions that store most of the similar data chunks, i.e., similar storage regions.

According to one embodiment, for each of the storage regions 2201-2203, a sketch for the storage region is generated, referred to herein as a region sketch. A sketch of a storage region may be generated based on the sketches of the data chunks (referred to herein as chunk sketches) stored therein. For example, a sketch of a storage region may be the maximum or minimum sketch amongst the sketches of the data chunks stored therein. Alternatively, a sketch of a storage region may be generated based on a pattern of the data chunks stored therein. The sketches of the storage regions 2201-2203 are then loaded into sketch index 2204 (for indexing storage regions). Region sketch index 2204 includes multiple entries, each entry corresponding to one of the sketches of storage regions 2201-2203. Each entry maps a particular sketch of a storage region ID (e.g., compression region ID or container ID). Entries of the region sketch index 2204 are then sorted based on the sketches of the storage regions, such that storage regions with the same sketch (representing the similar storage regions) are positioned adjacent to each other.

Once the similar storage regions are identified in a sketch index, data chunks of the similar storage regions are then retrieved from the identified storage regions such as storage regions 2201-2203. The sketches of the retrieved data chunks (e.g., chunk sketches) are obtained and loaded in chunk sketch index 2210 (for indexing data chunks) to identify the similar data chunks as described above. The similar data chunks are then reorganized, compressed, and stored together in one or more storage regions such as storage regions 2207-2208. In addition, one or more file recipes 2205 are maintained for subsequent file restoration.

According to one embodiment, in order to keep sketch index 2204 to a relatively small size, only frequently occurring sketches will be added into sketch index 2204. In a particular embodiment, a filter 2206 is utilized to screen out any less frequently occurring sketches and only stores frequently occurring sketches in sketch index 2204. For example, filter 2206 may be a counting bloom filter that counts a number of occurrences of a particular sketch. Alternatively, a set of regular bloom filters is configured with a balanced key assignment algorithm such that the bit allocation (e.g. set a bit to 1) of a sketch is proportional to the occurring times of the sketch.

Figure 23:
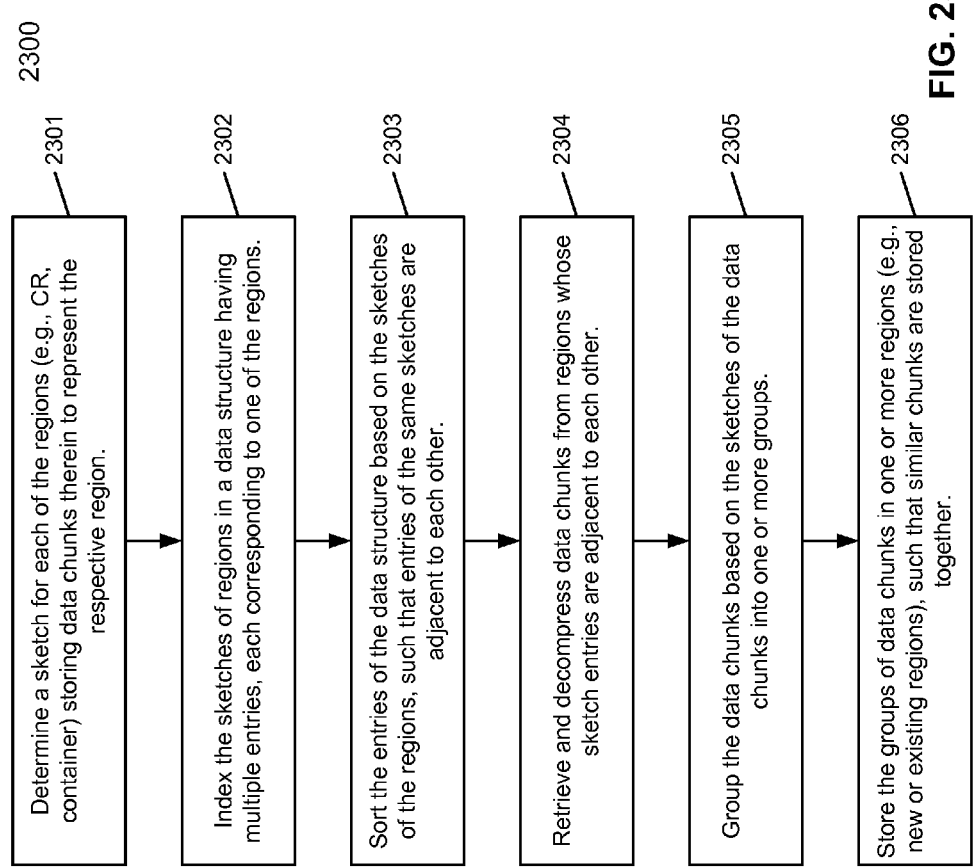
FIG. 23 is a flow diagram illustrating a method of indexing storage regions for reorganization according to one embodiment of the invention.

FIG. 23 is a flow diagram illustrating a method of indexing storage regions for reorganization according to one embodiment of the invention. Method 2300 may be performed by system 2200 of FIG. 22. Referring to FIG. 23, at block 2301, processing logic determines a region sketch for each of the storage regions (e.g., compression region or container) storing data chunks therein to represent the respective region. At block 2302, the region sketches of the storage regions are indexed in a data structure. The data structure includes multiple entries, each corresponding to one of the storage regions. Each entry maps a particular region sketch to a storage region identifier that identifies the corresponding storage region. At block 2303, the entries of the data structure are sorted based on the region sketches of the storage regions, such that entries with the same region sketch are positioned adjacent to each other. At block 2304, the data chunks of the similar regions are then retrieved from the storage and decompressed. At block 2305, similar data chunks are identified and grouped into one or more groups based on chunk sketches of the data chunks. At block 2306, the groups of the similar data chunks are then compressed and stored. Thereafter, the storage resources (e.g., storage space) associated with the original storage region(s) may be reclaimed for future usage.

Embodiment of Deduplication Storage Engine

Figure 24:
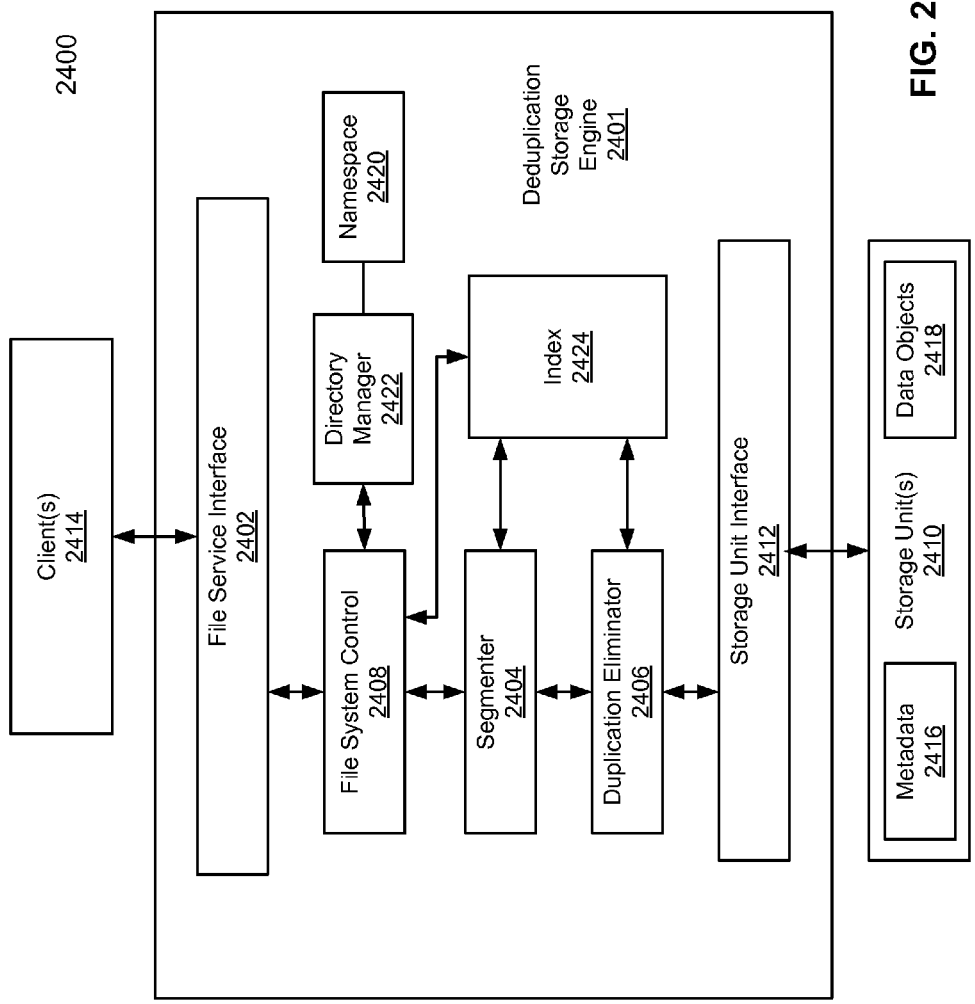
FIG. 24 is a block diagram illustrating a deduplicated storage system according to one embodiment of the invention.

FIG. 24 is a block diagram illustrating a deduplication storage system according to one embodiment of the invention. For example, deduplication storage system 2400 may be implemented as part of a deduplication storage system as described above, such as, for example, the deduplication storage system as a client and/or a server as shown in FIG. 1. In one embodiment, storage system 2400 may represent a file server (e.g., an appliance used to provide network attached storage (NAS) capability), a block-based storage server (e.g., used to provide storage area network (SAN) capability), a unified storage device (e.g., one which combines NAS and SAN capabilities), a near-line storage device, a direct attached storage (DAS) device, a tape backup device, or essentially any other type of data storage device. Storage system 2400 may have a distributed architecture, or all of its components may be integrated into a single unit. Storage system 2400 may be implemented as part of an archive and/or backup system such as a deduplicating storage system available from EMC® Corporation of Hopkinton, Mass.

In one embodiment, storage system 2400 includes a deduplication engine 2401 interfacing one or more clients 2414 with one or more storage units 2410 storing metadata 2416 and data objects 2418. Clients 2414 may be any kinds of clients, such as, for example, a client application, backup software, or a garbage collector, located locally or remotely over a network. A network may be any type of networks such as a local area network (LAN), a wide area network (WAN) such as the Internet, a corporate intranet, a metropolitan area network (MAN), a storage area network (SAN), a bus, or a combination thereof, wired and/or wireless.

Storage devices or units 2410 may be implemented locally (e.g., single node operating environment) or remotely (e.g., multi-node operating environment) via an interconnect, which may be a bus and/or a network (e.g., a storage network). In one embodiment, one of storage units 2410 operates as active storage to receive and store external or fresh user data from a client (e.g., an end-user client or a primary storage system associated with one or more end-user clients), while another one of storage units 2410 operates as a target storage unit to periodically archive data from the active storage unit according to an archiving policy or scheme. Storage units 2410 may be, for example, conventional magnetic disks, optical disks such as CD-ROM or DVD based storage, magnetic tape storage, magneto-optical (MO) storage media, solid state disks, flash memory based devices, or any other type of non-volatile storage devices suitable for storing large volumes of data. Storage units 2410 may also be combinations of such devices. In the case of disk storage media, the storage units 2410 may be organized into one or more volumes of redundant array of inexpensive disks (RAID). Data stored in the storage units may be stored in a compressed form (e.g., lossless compression: HUFFMAN coding, LEMPEL-ZIV WELCH coding; delta encoding: a reference to a chunk plus a difference; etc.). In one embodiment, different storage units may use different compression methods (e.g., main or active storage unit from other storage units, one storage unit from another storage unit, etc.).

The metadata, such as metadata 2416, may be stored in at least some of storage units 2410, such that files can be accessed independent of another storage unit. Metadata of each storage unit includes enough information to provide access to the files it contains. In one embodiment, metadata may include fingerprints contained within data objects 2418, where a data object may represent a data chunk, a compression region (CR) of one or more data chunks, or a container of one or more CRs. Fingerprints are mapped to a particular data object via metadata 2416, enabling the system to identify the location of the data object containing a data chunk represented by a particular fingerprint. A fingerprint may be generated based on at least a portion of a data chunk, for example, by applying a predetermined mathematical algorithm (e.g., hash function) to at least a portion of the content of the data chunk. When an active storage unit fails, metadata contained in another storage unit may be utilized to recover the active storage unit. When one storage unit is unavailable (e.g., the storage unit has failed, or is being upgraded, etc.), the system remains up to provide access to any file not stored in the failed storage unit. When a file is deleted, the metadata associated with the files in the system is updated to reflect that the file has been deleted.

In one embodiment, metadata 2416 may include a file name, a storage unit identifier (ID) identifying a storage unit in which the chunks associated with the file name are stored, reconstruction information for the file using the chunks, and any other appropriate metadata information. Metadata 2416 may further include a chunk ID, a chunk sketch, a hash of a chunk, an encrypted hash of a chunk, random data, or any other appropriate metadata. In some embodiments, metadata associated with a chunk is used to identify identical and/or similar data segments.

In one embodiment, a chunk ID includes one or more deterministic functions of a data chunk, one or more hash functions of a data chunk, random data, or any other appropriate data chunk ID. In various embodiments, a data chunk sketch includes one or more deterministic functions of a data chunk, one or more hash functions of a data chunk, one or more functions that return the same or similar value for the same or similar data chunks (e.g., a function that probably or likely returns a same value for a similar data segment), or any other appropriate data segment sketch. In various embodiments, sketch function values are determined to be similar using one or more of the following methods: numeric difference, hamming difference, locality-sensitive hashing, nearest-neighbor-search, other statistical methods, or any other appropriate methods of determining similarity. In one embodiment, sketch data includes one or more data patterns characterizing a chunk. For example, a sketch may be generated by applying one or more functions (e.g., hash functions) on a chunk and a subset of the results of the functions performed on the chunk (e.g., a number of results, for example the lowest or highest results of sixteen independent functions) are selected as a sketch.

In one embodiment, a copy of the metadata is stored on a storage unit for files stored on a storage unit so that files that are stored on the storage unit can be accessed using only the information stored on the storage unit. In one embodiment, a main set of metadata information can be reconstructed by using information of other storage units associated with the storage system in the event that the main metadata is lost, corrupted, damaged, etc. Metadata for a storage unit can be reconstructed using metadata information stored on a main storage unit or other storage unit (e.g., replica storage unit). Metadata information further includes index information (e.g., location information for chunks in storage units, identifying specific data objects).

In one embodiment, deduplication storage engine 2401 includes file service interface 2402, segmenter 2404, duplicate eliminator 2406, file system control 2408, and storage unit interface 2412. Deduplication storage engine 2401 receives a file or files (or data item(s)) via file service interface 2402, which may be part of a file system namespace 2420 of a file system associated with the deduplication storage engine 2401. The file system namespace 2420 refers to the way files are identified and organized in the system. An example is to organize the files hierarchically into directories or folders, which may be managed by directory manager 2422. File service interface 2412 supports a variety of protocols, including a network file system (NFS), a common Internet file system (CIFS), and a virtual tape library interface (VTL), etc.

The file(s) is/are processed by segmenter 2404 and file system control 2408. Segmenter 2404, also referred to as a content store, breaks the file(s) into variable-length chunks based on a variety of rules or considerations. For example, the file(s) may be broken into chunks by identifying chunk boundaries. Chunk boundaries may be determined using file boundaries, directory boundaries, byte counts, content-based boundaries (e.g., when a hash of data in a window is equal to a value), or any other appropriate method of determining a boundary. Reconstruction of a data block, data stream, file, or directory includes using one or more references to the one or more chunks that originally made up a data block, data stream, file, or directory that was/were previously stored.

In some embodiments, chunks are segmented by identifying chunk boundaries that are content-based—for example, a hash function is applied to values of data within a sliding window through the data stream or block and when the hash function is equal to a value (or equal to one of several values) then a chunk boundary is identified. In various embodiments, chunk boundaries are identified using content based functions operating on windows within a data stream or block that have a minimum or maximum or other value or any other appropriate content based chunking algorithm. In various embodiments, chunks include fixed-length chunks, variable length chunks, overlapping chunks, non-overlapping chunks, chunks with a minimum size, chunks with a maximum size, or any other appropriate chunks. In various embodiments, chunks include files, groups of files, directories, a portion of a file, a portion of a data stream with one or more boundaries unrelated to file and/or directory boundaries, or any other appropriate chunk.

In one embodiment, file system control 2408, also referred to as a file system manager, processes information to indicate the chunk(s) association with a file. In some embodiments, a list of fingerprints is used to indicate chunk(s) associated with a file. File system control 2408 passes chunk association information (e.g., representative data such as a fingerprint) to index 2424. Index 2424 is used to locate stored chunks in storage units 2410 via storage unit interface 2412. Duplicate eliminator 2406, also referred to as a segment store, identifies whether a newly received chunk has already been stored in storage units 2410. In the event that a chunk has already been stored in storage unit(s), a reference to the previously stored chunk is stored, for example, in a chunk tree associated with the file, instead of storing the newly received chunk. A chunk tree of a file may include one or more nodes and each leaf node represents or references one of the deduplicated chunks stored in storage units 2410 that make up the file. Chunks are then packed by a container manager (which may be implemented as part of storage unit interface 2412) into one or more storage containers stored in storage units 2410. The deduplicated chunks may be further compressed into one or more CRs using a variation of compression algorithms, such as a Lempel-Ziv algorithm before being stored. A container may contain one or more CRs and each CR may contain one or more chunks (also referred to as segments). A container may further contain the metadata such as fingerprints, sketches, type of the data chunks, etc. that are associated with the data chunks stored therein.

When a file is to be retrieved, file service interface 2402 is configured to communicate with file system control 2408 to identify appropriate chunks stored in storage units 2410 via storage unit interface 2412. Storage unit interface 2412 may be implemented as part of a container manager. File system control 2408 communicates (e.g., directly or via segmenter 2404) with index 2424 to locate appropriate chunks stored in storage units via storage unit interface 2412. Appropriate chunks are retrieved from the associated containers via the container manager and are used to construct the requested file. The file is provided via interface 2402 in response to the request. In one embodiment, file system control 2408 utilizes a tree (e.g., a chunk tree obtained from namespace 2420) of content-based identifiers (e.g., fingerprints) to associate a file with data chunks and their locations in storage unit(s). In the event that a chunk associated with a given file or file changes, the content-based identifiers will change, and the changes will ripple from the bottom to the top of the tree associated with the file efficiently since the appropriate content-based identifiers are easily identified using the tree structure. Note that some or all of the components as shown as part of deduplication engine 2401 may be implemented in software (e.g., executable code executed in a memory by a processor), hardware (e.g., processor(s)), or a combination thereof. For example, deduplication engine 2401 may be implemented in a form of executable instructions that can be stored in a machine-readable storage medium, where the instructions can be executed in a memory by a processor.

In one embodiment, storage system 2400 may be used as a tier of storage in a storage hierarchy that comprises other tiers of storage. One or more tiers of storage in this hierarchy may utilize different kinds of storage devices and/or may be optimized for different characteristics such as random update performance. Files are periodically moved among the tiers based on data management policies to achieve a cost-effective match to the current storage requirements of the files. For example, a file may initially be stored in a tier of storage that offers high performance for reads and writes. As the file ages, it may be moved into a tier of storage according to one embodiment of the invention. In various embodiments, tiers include different storage technologies (e.g., tape, hard drives, semiconductor-based memories, optical drives, etc.), different locations (e.g., local computer storage, local network storage, remote network storage, distributed storage, cloud storage, archive storage, vault storage, etc.), or any other appropriate storage for a tiered data storage system.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method for improving data compression of data chunks of a storage system, the method comprising:
   in response to a sequence of data to be stored in a memory, partitioning, by using a computer system, the sequence of data into a plurality of data chunks according to a predetermined chunking algorithm;
   generating, by using a computer system, a sketch for each data chunk of the data chunks based on one or more features extracted from the data chunk;
   identifying, by using the computer system, an existing compression region for each data chunk based on a sketch of the data chunk;
   grouping, by using the computer system, said each data chunk of the data chunks of the sequence of data with one of a plurality of groups based on the sketch of the data chunk, wherein each group of the plurality of groups is represented by a sketch, wherein the grouping said each data chunk of the data chunks of the sequence of data comprises merging the data chunk of the sequence of data with data chunks of the identified existing compression region and reorganizing the data chunks of the sequence of data and data chunks of the existing compression region from an original sequence order to a second sequence order, wherein similar data chunks are positioned adjacent to each other;
   determining, by using the computer system, whether a number of data chunks of said each group of the plurality of the groups reaches a predetermined threshold; and
   in response to the determining that the number of data chunks of said each group of the plurality of the groups reaches a predetermined threshold, compressing, by using the computer system, and storing in the memory of the computer system data chunks of said each group of the plurality of groups in a corresponding existing compression region of the storage system so that the similar data chunks are compressed and stored in the same compression region, wherein said each group of the plurality of the groups is related with a buffer that stores a plurality of data chunks from the sequence of data that have the same sketch.

2. The method of claim 1, wherein each group is associated with a buffer that buffers a plurality of existing data chunks having the same sketch that have been previously stored in the storage system.

3. The method of claim 2, wherein associating each data chunk of the sequence of data with one of a plurality of groups based on the sketch comprises: identifying an existing compression region based on the sketch of data chunk of the sequence of data.

4. The method of claim 3, further comprising:
   retrieving and decompressing data chunks from the identified existing compression region; and storing the data chunks in one of the groups associated with the sketch of the data chunk.

5. The method of claim 4, further comprising writing the group of the merged data chunks to a new compression region, wherein a previous compression region space is reclaimed after the group of the merged data chunks have been written to the new compression region.

6. A non-transitory machine-readable medium having instructions stored therein, which when executed by a processor, cause the processor perform operations of improving data compression of data chunks of a storage system, the operations comprising:
   in response to a sequence of data to be stored in a memory, partitioning, by using a computer system, the sequence of data into a plurality of data chunks according to a predetermined chunking algorithm;
   generating, by using a computer system, a sketch for each data chunk of the data chunks based on one or more features extracted from the data chunk;
   identifying, by using the computer system, an existing compression region for each data chunk based on a sketch of the data chunk;
   grouping, by using the computer system, said each data chunk of the data chunks of the sequence of data with one of a plurality of groups based on the sketch of the data chunk, wherein each group of the plurality of groups is represented by a sketch, wherein the grouping said each data chunk of the data chunks of the sequence of data comprises merging the data chunk of the sequence of data with data chunks of the identified existing compression region and reorganizing the data chunks of the sequence of data and data chunks of the existing compression region from an original sequence order to a second sequence order, wherein similar data chunks are positioned adjacent to each other;
   determining, by using the computer system, whether a number of data chunks of said each group of the plurality of the groups reaches a predetermined threshold; and in response to the determining that the number of data chunks of said each group of the plurality of the groups reaches the predetermined threshold, compressing, by using the computer system, and storing in the memory of the computer system data chunks of said each group of the plurality of groups in a corresponding existing compression region of the storage system so that the similar data chunks are compressed and stored in the same compression region, wherein said each group of the plurality of the groups is related with a buffer that stores a plurality of data chunks from the sequence of data that have the same sketch.

7. The machine-readable medium of claim 6, wherein each group is associated with a buffer that buffers a plurality of existing data chunks having the same sketch that have been previously stored in the storage system.

8. The machine-readable medium of claim 7, wherein associating each data chunk of the sequence of data with one of a plurality of groups based on the sketch comprises: identifying an existing compression region based on the sketch of data chunk of the sequence of data.

9. The machine-readable medium of claim 8, wherein the operations further comprise: retrieving and decompressing data chunks from the identified existing compression region; and storing the data chunks in one of the groups associated with the sketch of the data chunk.

10. The machine-readable medium of claim 9, wherein the operations further comprise writing the group of the merged data chunks to a new compression region, wherein a previous compression region space is reclaimed after the group of the merged data chunks have been written to the new compression region.

11. A computer system for processing data, comprising:
a processor; and a memory coupled to the processor to store instructions, which when executed by the processor, cause the processor to perform operations, the operations including:
in response to a sequence of data to be stored in the memory, partitioning the sequence of data into a plurality of data chunks according to a predetermined chunking algorithm,
generating a sketch for each data chunk of the data chunks based on one or more features extracted from the data chunk,
identifying an existing compression region for each data chunk based on a sketch of the data chunk,
grouping each data chunk of the data chunks of the sequence of data with one of a plurality of groups based on the sketch of the data chunk, wherein each group of the plurality of groups is represented by a sketch, wherein the grouping said each data chunk of the data chunks of the sequence of data comprises merging the data chunk of the sequence of data with data chunks of the identified existing compression region and reorganizing the data chunks of the sequence of data and data chunks of the existing compression region from an original sequence order to a second sequence order, wherein similar data chunks are positioned adjacent to each other,
determining whether a number of data chunks of said each group of the groups reaches a predetermined threshold, and
in response to the determining that the number of data chunks of said each group of the plurality of the groups reaches the predetermined threshold, compressing and storing in the memory data chunks of the each group in a corresponding existing compression region of a storage system of a computer so that the similar data chunks are compressed and stored in the same compression region, wherein said each group of the groups is related with a buffer that stores a plurality of data chunks from the sequence of data that have the same sketch.

12. The system of claim 11, wherein each group is associated with a buffer that buffers a plurality of existing data chunks having the same sketch that have been previously stored in the storage system.

13. The system of claim 11, wherein associating each data chunk of the sequence of data with one of a plurality of groups based on the sketch comprises: identifying an existing compression region based on the sketch of data chunk of the sequence of data.

14. The system of claim 13, wherein the operations further comprise: retrieving and decompressing data chunks from the identified existing compression region; and storing the data chunks in one of the groups associated with the sketch of the data chunk.

15. The system of claim 14, wherein the operations further comprise writing the group of the merged data chunks to a new compression region, wherein a previous compression region space is reclaimed after the group of the merged data chunks have been written to the new compression region.

* * * * *